United States Patent [19]
Yamamoto et al.

[11] Patent Number: 5,731,741
[45] Date of Patent: Mar. 24, 1998

[54] RECEIVER FREQUENCY SYNTHESIZER-TUNER PROVIDING HIGH SPEED TUNING

[75] Inventors: Yuji Yamamoto; Toshihito Ichikawa, both of Saitama, Japan

[73] Assignee: Pioneer Electronic Corporation, Tokyo, Japan

[21] Appl. No.: 728,973

[22] Filed: Oct. 11, 1996

[30] Foreign Application Priority Data

Oct. 13, 1995 [JP] Japan .................................. 7-292062
Oct. 26, 1995 [JP] Japan .................................. 7-278712

[51] Int. Cl.$^6$ .............................. H03L 7/087; H04B 1/16
[52] U.S. Cl. .................. 331/11; 331/14; 331/17; 331/25; 455/183.2; 455/184.1; 455/186.1
[58] Field of Search .............................. 331/25, 11, 14, 331/17; 405/183.2, 184.1, 186.1

[56] References Cited

U.S. PATENT DOCUMENTS 5,450,621  9/1995  Kianush et al. ..................... 455/192.2
5,525,935  6/1996  Joo et al. .............................. 331/11

*Primary Examiner*—Siegfried H. Grimm
*Attorney, Agent, or Firm*—Sughrue, Mion, Zinn, Macpeak & Seas, PLLC

[57] ABSTRACT

An apparatus for acquiring tuning for a tuning frequency at a high speed. In a receiver, a tuning control unit holds inputted tuning frequency information at a designated address in accordance with a storage designation signal supplied from a control unit and controls the frequency of a VCO based on the tuning frequency information held at a designated address in accordance with a read designation signal supplied from the control unit. Further, in a frequency comparison loop including a frequency comparator for acquiring a frequency difference between a target tuning frequency and the VCO frequency, a count time setting circuit sets the count time for measuring the VCO frequency, and the count time is increased whenever measurement of the VCO frequency is repeated.

6 Claims, 18 Drawing Sheets

STORAGE
INSTRUCTING
SIGNAL

READ
INSTRUCTING
SIGNAL

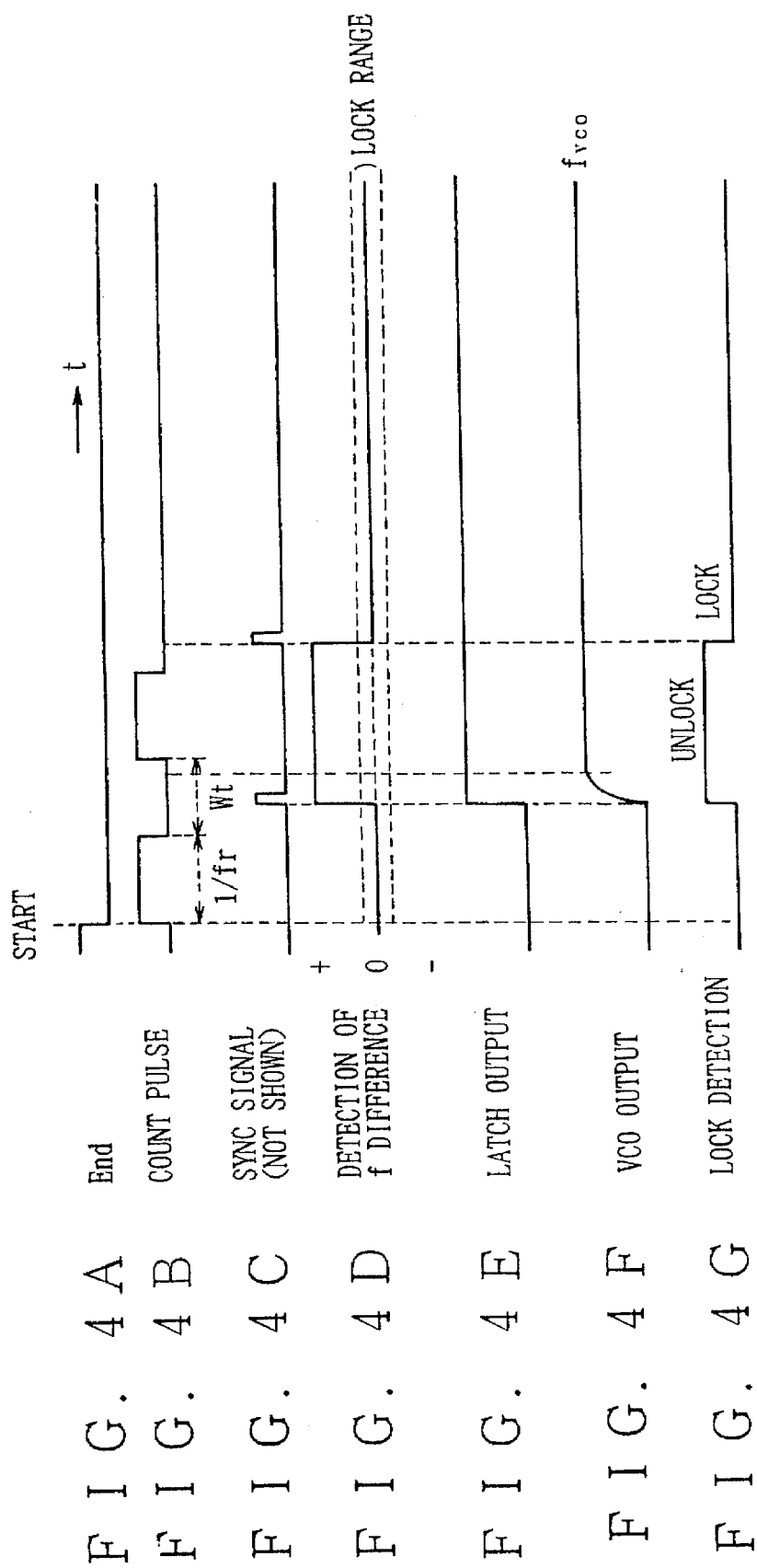

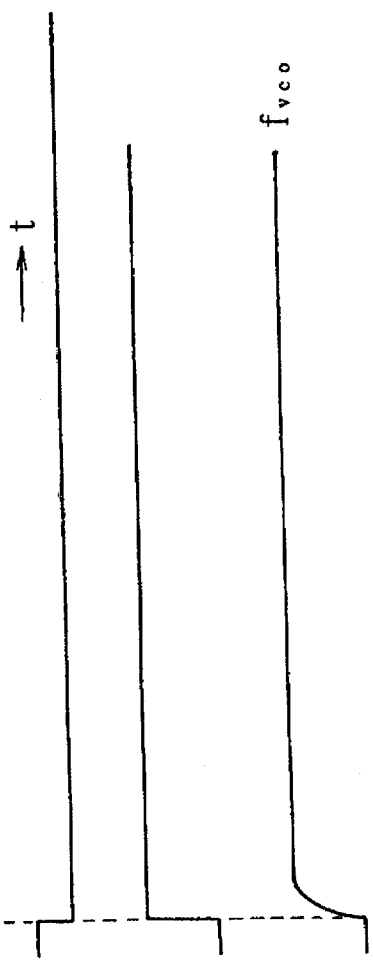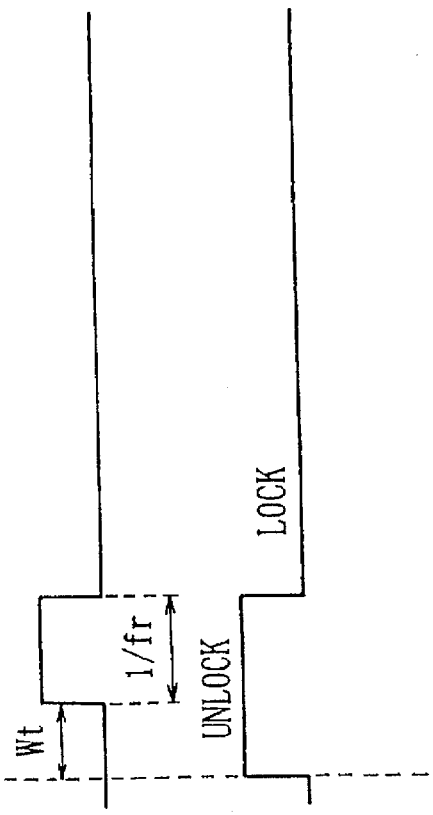
FIG. 5A End
FIG. 5B LATCH OUTPUT
FIG. 5C VCO OUTPUT
FIG. 5D COUNT PULSE
FIG. 5E LOCK DETECTION

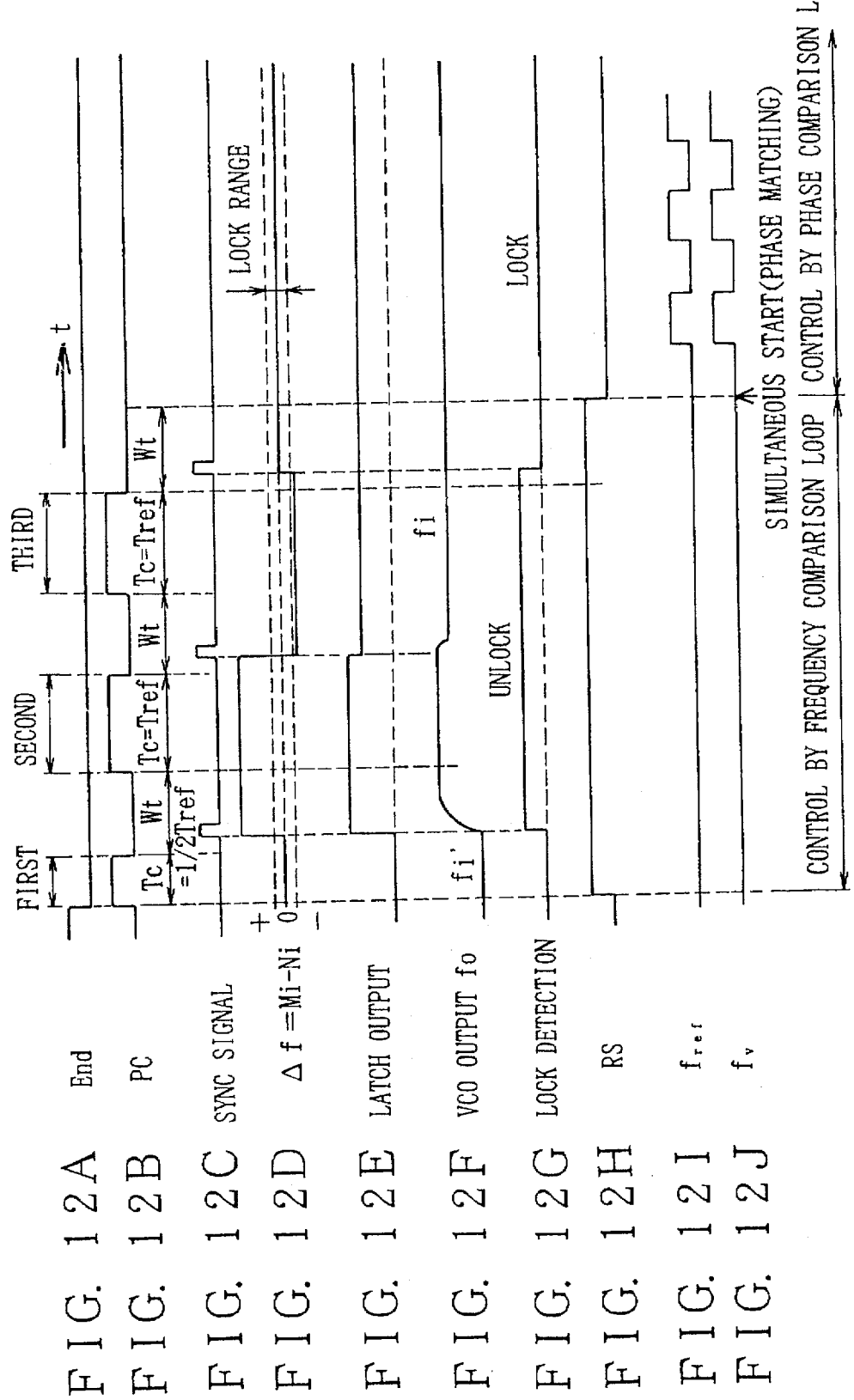

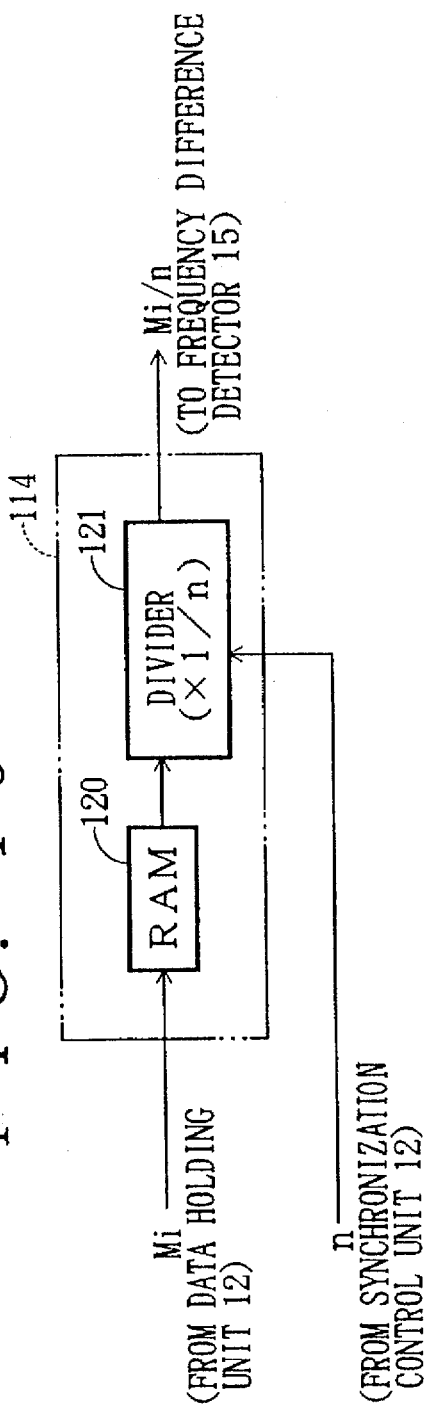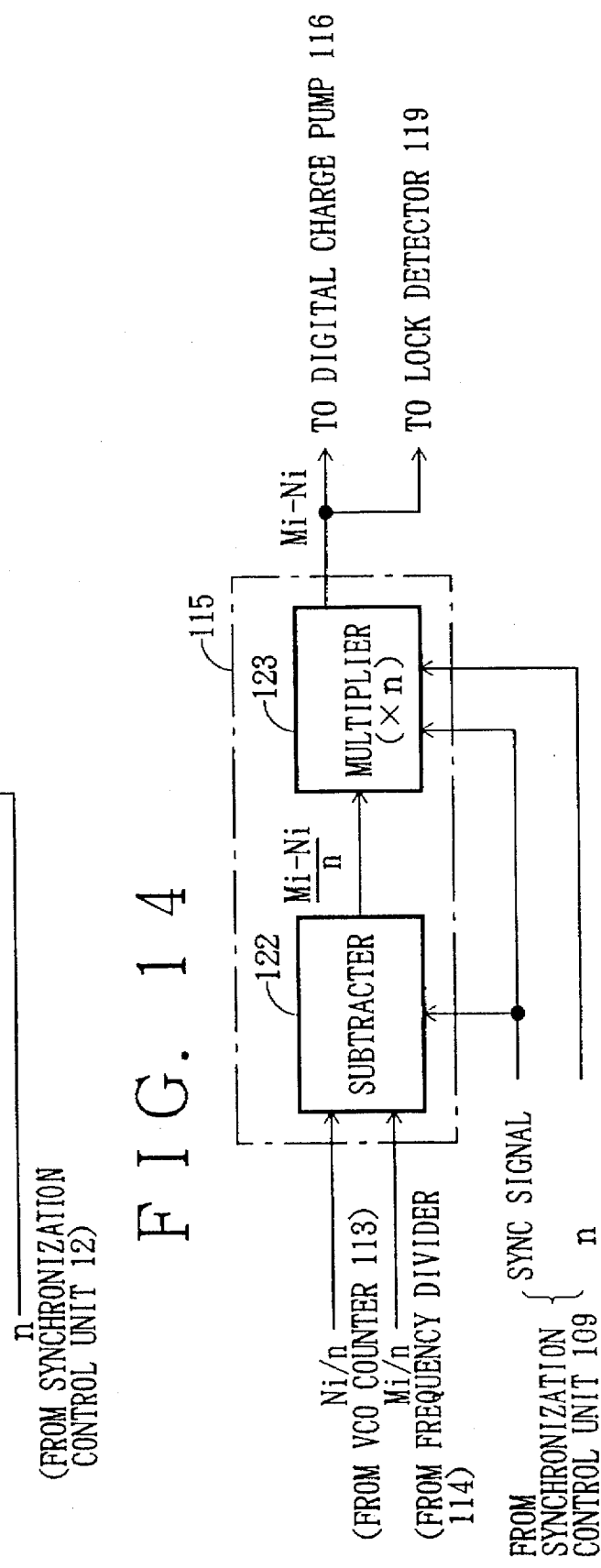

RECEIVER FREQUENCY SYNTHESIZER-TUNER PROVIDING HIGH SPEED TUNING

BACKGROUND OF THE INVENTION

The present invention relates to an apparatus for acquiring tuning for a channel-tuning (hereinafter also referred to as simply "tuning") frequency at a high speed, and more particularly to a receiver having a tuning control section for tuning a receiving section to a desired tuning frequency and a frequency synthesizer tuner used therefor.

A prior art for the first aspect of the present invention will be explained below.

A receiver for FM and AM generally includes a signal receiving section, a tuning control section and a control section.

FIG. 18 shows a conventional receiver in block form. As seen from the figure, a receiver 51 includes a receiving section 52, a tuning control section 53 and a control section 54. The receiving section 52 includes a voltage controlled oscillator (hereinafter referred to as "VCO") and can vary a tuning frequency in response to a control signal from the tuning control section. The receiving section 52 is tuned to the frequency of a selected channel and demodulates a modulated signal from the received signal.

The tuning control section 53 controls to set the tuning frequency of the receiving section 52 for a frequency to be selected and conventionally uses a PLL (Phased Locked Loop).

The control section 54 which can be constructed by a microcomputer serves to perform setting the tuning control section 53 for a selected frequency, processing of input information inputted from a user and processing for the operation of whole appliances such as display processing.

In such a receiver, when the received frequency is to be varied, first, the frequency-division data Mi defining a new oscillation frequency of VCO is inputted to the tuning control section 53 from the control section 54.

The tuning control section 53 detects a phase difference between a reference signal internally created and a comparison signal resulting from division of the oscillation frequency of VCO from the receiving section 52 by the frequency-division data Mi and supplies the control signal output according to the phase difference to the VCO of the receiving section 52, thereby controlling the oscillating frequency of the VCO.

Specifically, the PLL loop constituted by the receiving section 52 and tuning control section controls the oscillating frequency of VCO to converge into a value to be set and maintained.

When the oscillating frequency of VCO reaches the frequency to be set by control by the tuning control section 53, the tuning control section 53 produces a lock signal representative of this fact to the control section 54. Thus, the control section recognizes completion of channel.

Thus, the time required to select a designated channel is defined by the time from when the division data Mi to be set is produced from the control section 54 to when the lock signal is inputted to the control section 54.

It is well known that the receiver using a PLL loop can be tuned to plural channels by suitably setting the frequency Mi of the program divider constituting the loop.

With development of multi-function of the receiver in recent years, it has become necessary to vary the receiving frequency continuously and tune the receiver to plural frequencies continuously in a short time.

For example, in the RDS system which has been put into practice in Europe, a receiver, which has a function of network-follow based on a list of substitutive channels in the same network obtained from received data, is tuned to frequencies of plural alternative channels to check its receiving state in order to determine a channel providing a good receiving state previously.

Further, another receiver, which has a function of deciding coincidence of a present received channel with an alternative channel on the basis of respective demodulated audio outputs, performs coincidence decision processing of changing the receiving frequency continuously to receive the present receiving channel and the substitutive channel alternately and comparing demodulated outputs from both channels.

In these conventional receivers, such continuous channel-tuning processing considers, as a single process, the process from when the frequency dividing data Mi to be set is produced from the control section 54 to when the lock signal or a signal representative of completion of acquisition of a demodulated output of the substitutive channel is inputted to the control section 54, and performs such processes in parallel to change the receiving frequency continuously.

As described above, when the tuning frequency is to be changed, the conventional receivers transmit the frequency division data Mi to the tuning control section 53. The frequency division data Mi of the receiver having a wide receiving band, which is generally represented by ten bits or more, takes a longer time for its transmission. This make it impossible to shorten the tuning time for channel tuning. Particularly, where the tuning frequency for channel tuning is to be changed, it is necessary to perform the entire processing in a short time so that the time required to select each channel must be shortened.

A first object of the present invention is to provide a receiver which can shorten the time for channel tuning when the tuning frequency is to be changed.

A prior art of the second aspect of the present invention will be explained below. The second aspect of the present invention relates to a frequency synthesizer tuner.

A frequency synthesizer tuner generally adopts a PLL circuit in a receiving section for demodulating a received signal in tune with a target channel tuning frequency. FIG. 19 shows the theory of a PLL circuit used in the conventional frequency synthesizer tuner.

The PLL circuit used in the conventional frequency synthesizer, as shown in FIG. 19, includes a phase comparator 101, a low-pass filter (LPF) 102, a voltage controlled oscillator (VCO) 103 and a programmable divider 104 constituting a frequency divider.

In operation, a reference signal $f_{ref}$ and frequency-divided output $f_v = f_0/M_i$ ($M_i$ represents the frequency-division value providing a target tuning frequency) are supplied to the phase comparator 101. The phase comparator 101 detects the phase difference $\Delta\theta$ between these two input signals $f_{ref}$ and $f_v$. The LPF 102 converts the phase difference signal $\Delta\theta$ into a direct current which is in turn supplied to the VCO 103. The oscillating frequency of the VCO 103 varies with the voltage controlled signal sent from the LPF 102. The oscillating output of the VCO 103 is sent to the phase comparator 101 through the programmable divider 104 again to repeat the above operation of phase comparison. As a result of repetition of such phase comparison, the oscillating frequency of the VCO 103 is finally converged into $f_0 = M_i \times f_{ref}$.

Therefore, if various frequency division values $M_i$ are prepared so that the oscillating frequency $f_O$ coincides with target tuning frequencies, the frequency division value $M_i$ of the programmable divider 104 has only to vary to change a target channel freely. As understood from the equation $f_O=M_i \times f_{ref}$, the tuning accuracy of the frequency synthesizer tuner depends on the reference frequency $f_{ref}$.

The frequency synthesizer tuner using PLL must satisfy contradictory conditions that in signal reception, the PLL system is stable, the time ("lock-up time") taken to reach a target frequency is as small as possible, and noise in the system in locking is small. Therefore, if the loop constant of the PLL circuit is set taking only the lock-up time seriously into consideration, the system is not stable and so suited to practical use.

For this reason, in the ordinary frequency synthesizer tuner, the loop constant of the PLL circuit was set so as to satisfy the above respective conditions in a practical use. Thus, it was difficult to shorten the lock-up time so that in changing the tuning frequency, muting processing is carried out in order to prevent noise from being generated, thereby attenuating a demodulated output as necessity requires.

In order to solve the above problem, the inventors of this application proposed a frequency synthesizer tuner which can greatly shorten the lock-up time and does not require the muting processing in changing the tuning frequency. FIG. 20 shows the principle of the PLL circuit adopted in the previous proposal.

The PLL circuit shown in FIG. 20 adds, to the circuit shown in FIG. 19, a frequency comparing means 5 for acquiring a frequency difference between the oscillation frequency $f_O$ of the VCO 103 and the target tuning frequency $f_i$. Namely, a frequency comparison loop constituted by the frequency comparison means 105 is newly added to the ordinary phase comparison loop. In FIG. 20, like reference numerals refer to like parts in FIG. 19.

The PLL circuit of FIG. 20 operates as follows. At the start of exchanging the tuning frequency, a switch 106 is located in an off state so that the phase comparison loop by the phase comparator 101 is previously opened. In this state, first, the frequency difference $\Delta f$ between the oscillating frequency $f_O$ of VCO 103 and a target tuning frequency $f_i$ is acquired by the frequency comparison means 105. The frequency difference signal $\Delta f$ is fed back to the LPF 102.

Thus, the oscillating frequency of the VCO 3 varies towards the target tuning frequency $f_i$. A lock detector (not shown) detects that the oscillation frequency $f_O$ has substantially reached the target tuning frequency $f_i$. Then, the switch 106 is turned on to operate the phase comparison loop by the phase comparator 101 so that the ordinary PLL operation starts.

In such a configuration, control is carried out through the frequency comparison loop until the oscillation frequency $f_O$ of the VCO 3 becomes substantially equal to the target tuning frequency $f_i$. This makes the phase comparison operation unnecessary so that the oscillation frequency $f_O$ of the VCO 3 can be shifted to the tuning frequency $f_i$ at a high speed. Thus, the lock-up time can be greatly shortened.

The above frequency synthesizer tuner was sufficiently satisfactory in performance. However, from the standpoint of high-speed change of a receiving channel, the lock-up time is desired to be as small as possible. For example, when the channel is changed while a person is listening to the radio during motor driving at high speed, an RDS (radio data system) using multiplex broadcasting put into practice in Europe has a function of searching another channel which is broadcasting the same program as that which has been heard until then and automatically tuning the receiving channel. In order to realize such a function, it is necessary to check the receiving status of substitutive candidates which are broadcasting the same program. As the above lock-up time is smaller, the checking can be made at a higher speed, thus making unnecessary the muting in changing the receiving channel.

In the PLL circuit of the above frequency synthesizer tuner, as shown in FIG. 21, the frequency comparison means 105 uses the one period $T_{ref}$ (hereinafter referred to as "reference period", $T_{ref}=1/f_{ref}$) of a reference frequency $f_{ref}$ as a count time $T_c$. By counting the number of oscillating pulses during the count time $T_c=T_{ref}$, the oscillating frequency $f_O$ of the VCO 103 is acquired so as to calculate its frequency difference $\Delta f$ from the target tuning frequency $f_i$. In FIG. 21, symbol $W_t$ represents the wait time from when the oscillating frequency of the VCO 3 is changed to be stabilized to when detection of the next frequency difference can be performed.

The reason why the reference period $T_{ref}$ is used as the count time for measuring the oscillation frequency $f_O$ of the VCO 103 is as follows. Assuming that the target tuning frequency is $f_i$, the frequency division value $M_i$ set for the programmable divider 104 in the phase comparison loop can be expressed by $$M_i = f_i/f_{ref} = f_i \cdot T_{ref}$$

As seen from the equation, the frequency division value $M_i$ represents the number of pulses at the tuning frequency $f_i$ during the reference period $T_{ref}$. In terms of the difference between the number of oscillating pulses counted in the VCO 103 during reference period $T_{ref}$ and the frequency division value, the frequency difference between the target tuning frequency $f_i$ and the oscillating frequency $f_O$ can be easily calculated.

The processing of detecting the frequency difference must be performed at least several times until the oscillating frequency of the VCO 103 becomes substantially equal to the target tuning frequency $f_i$. Therefore, in order that the oscillating frequency of the VCO 103 is varied to reach the target tuning frequency $f_i$, the processing time corresponding to at least several periods of the reference period $T_{ref}$ is required. If the total time required to reach the target tuning frequency can be shortened, the lock-up time can be further shortened correspondingly.

On the basis of a further research after the frequency synthesizer tuner was proposed previously, the inventors of the present invention have developed a new frequency synthesizer tuner which can further shorten the time taken for the oscillating frequency of the VCO 3 to reach the target tuning frequency $f_i$ to decrease the lock-up time.

Thus, the second object of the present invention is to provide a frequency synthesizer tuner which can further shorten the lock-up time.

In order to attain the first object of the present invention, there is provided a receiver comprising a control unit; a tuning control unit and a receiving unit which includes a VCO which can vary a tuning frequency, under the control of the tuning control unit, so as to be tuned to the frequency of a desired channel, demodulates a modulated signal and outputs the demodulated signal; said control unit capable of outputting to said tuning control unit a storage instructing signal inclusive of tuning frequency information to be stored and its address and read instructing signal inclusive of information for designating the address of the tuning frequency information stored and information for instructing read of the tuning frequency information stored at a designated address; and said tuning control unit capable of holding the inputted tuning frequency information at the designated address in accordance with the storage designation signal supplied from said control unit and of controlling the oscillating frequency of the VCO based on the tuning frequency information held at the designated address in accordance with the read instructing signal supplied from said control unit.

In the above receiver, the tuning control unit preferably stores a control value for controlling the oscillating frequency corresponding to the tuning frequency stored.

In accordance with the first aspect of the present invention, with the tuning frequency information previously stored in the tuning control unit, the stored tuning information is read for tuning processing as necessity requires. Therefore, in reading stored information, the information relative to the address of the tuning control unit having a less amount of information than that relative to tuning frequency has only to be transferred, thus permitting the tuning time to be shortened.

Further, in the above preferred embodiment, the control value for controlling the VCO is stored in correlation with the information of tuning frequency, thus permitting the tuning time to be further shortened.

In order to attain the second object of the present invention, there is provided a frequency synthesizer tuner comprising a frequency comparing means for acquiring a signal indicative of a frequency difference between a target tuning frequency and an oscillating frequency of a VCO; a frequency comparison loop for feeding back the acquired frequency difference signal to the VCO to control the oscillating frequency of the VCO so that the tuning frequency is adjusted; and a count time setting means for setting the count time for measuring the oscillating frequency of the VCO used by the frequency comparing means, wherein the count time is increased whenever measurement of the oscillating frequency of the VCO is repeated by the frequency comparing means.

In the above frequency synthesizer tuner, at least the frequency comparing means is preferably constituted as a digital circuit, and a D/A converter is preferably provided at the output of the frequency comparing means so that the input/output conversion characteristic of the D/A converter is the same as the voltage—frequency characteristic of the VCO.

In accordance with the second aspect of the present invention, the time taken for the oscillating frequency of the VCO is shortened to reach a target tuning frequency to reduce the lock-up time.

In the preferred embodiment of the second aspect of the present invention, a conversion error due to a difference in the conversion characteristic between the VCO and D/A converter is removed so that the lock-up time can be further decreased.

The above and other objects and features of the present invention will be more apparent from the following description taken in conjunction with the accompanying drawings.

BRIEF DESCRIPTION OF THE DRAWINGS

FIGS. 4A to 4G are timing charts of a tuning operation in storage processing by the tuning control section in the receiver in FIG. 1;

FIGS. 5A to 5E are timing charts of a tuning operation in read processing by the tuning control section of in the receiver in FIG. 1;

FIGS. 12A to 12J are timing charts showing the operation of the PLL circuit in FIG. 11;

FIG. 13 is a concrete example of the $M_i$ dividing unit 114 in FIG. 11;

FIG. 14 is a concrete example of the frequency difference detector 115 in FIG. 11;

DESCRIPTION OF THE PREFERRED EMBODIMENTS

ASPECT 1

Figure 1:
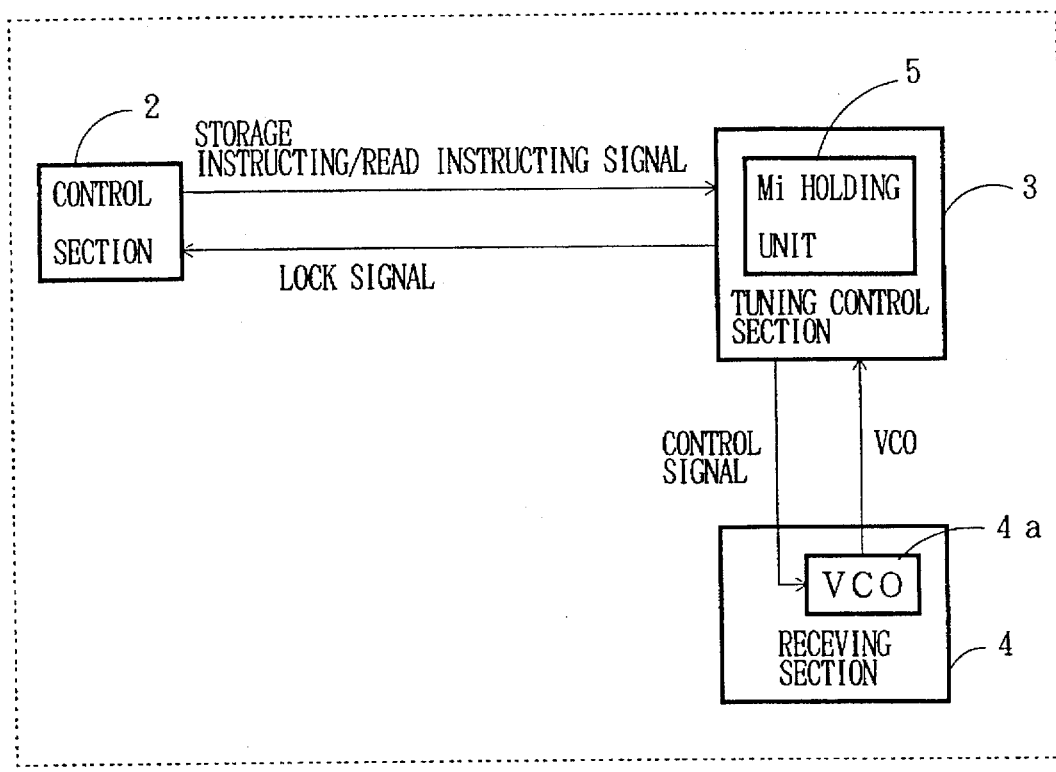
FIG. 1 is a block diagram showing the main part of a receiver according to the first aspect of the present invention.

Now referring FIG. 1, to an explanation will be given of preferred embodiments according to the first aspect of the present invention. FIG. 1 is a block diagram of the main parts of a receiver according to the present invention. As seen from the figure, the receiver 1 includes a receiving section 4, a control section 2 and a tuning control section 3.

The receiving unit 4 includes a VCO 4a which can vary a tuning frequency under the control of the tuning control section so as to be tuned to the frequency of a desired channel, demodulates a modulated signal and outputs the demodulated signal.

The control section 2, which is constructed by a microprocessor, controls the operation of the entire receiver with respect to display and holds information on a tuning frequency, i.e., the frequency division data $M_i$ about the oscillating frequency of VCO $4a$ over an entire receiving bandwidth.

The control section 2 can supply, to said tuning control unit, a storage instructing signal inclusive of tuning frequency information to be stored and its address and a read instructing signal inclusive of information addressing the tuning frequency information stored and information instructing read of the tuning frequency information stored at the designated address, respectively.

The tuning control section 3 is provided with a unit for holding a tuning frequency information holding unit ($M_i$ holding unit) 5. The tuning control section 3 holds the inputted tuning frequency information at a designated address of the $M_i$ holding unit 5 in accordance with the storage instructing signal supplied from the control unit 2, and reads the tuning frequency information held at the designated address of the $M_i$ holding unit 5 in accordance with the read designation signal supplied from the control section 2 to control the frequency of the VCO 4a.

The tuning control section 3 supplies to the control unit 2 a lock signal representing that the VCO 4a has been converged into a predetermined oscillating frequency.

Specifically, the control section 2, which performs the processing on the operation such as designation of a tuning frequency, processing of input information inputted from a user, display processing, etc., supplies to the tuning control section 3 the frequency division data $M_i$ to be stored and the address information on its address.

The input frequency division data $M_i$ is held at the designated address of the $M_i$ holding section 5. By this storage processing, the control section 2 completes the preparation for using the frequency division data $M_i$ stored in the $M_i$ holding section 5 for tuning.

After the storage processing, as necessity requires, the control section 2 uses the frequency division data $M_i$ stored in the $M_i$ holding unit 5.

In this case, in order that the tuning control unit 3 controls the VCO 4a on basis of the tuning frequency information, the control unit 2 supplies, to the tuning control unit 3, a read instructing signal inclusive of information for designating the address of the $M_i$ holding section 5 where the frequency division data $M_i$ used for tuning is stored and information for instructing read of the frequency division data $M_i$ stored at the designated address.

In response to the read instructing signal, the tuning control unit 3 reads, from the $M_i$ holding section 5, the frequency division data $M_i$ held at the address designated by the address designation information.

Using the frequency division data $M_i$ thus read, the tuning control unit 3 controls the oscillating frequency of the VCO 4a so that it is converged into the target oscillating frequency.

Figure 2:
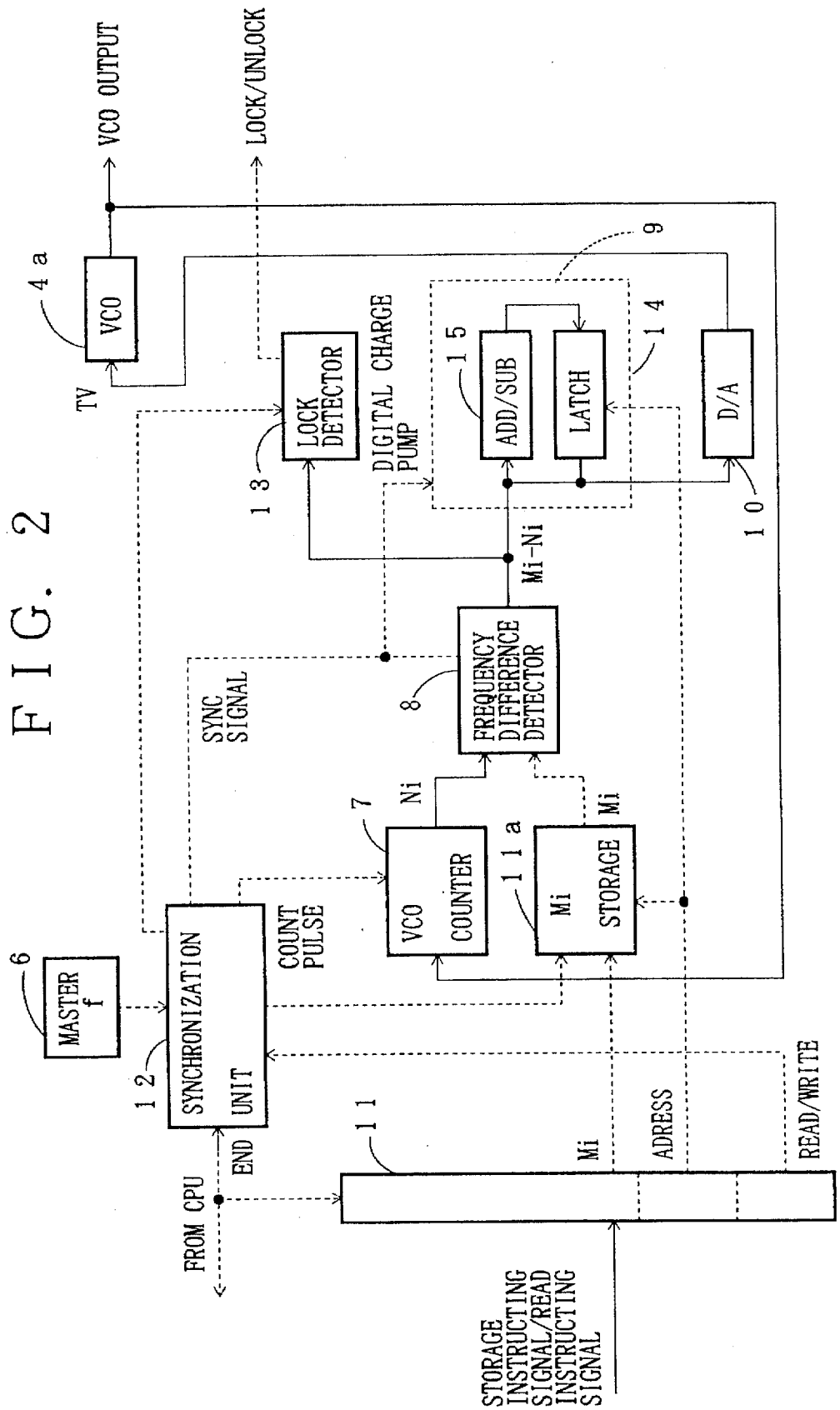
FIG. 2 is a block diagram showing the details of the tuning control unit in the receiver in FIG. 1.

Referring to FIG. 2, an explanation will be given of the details of the tuning control section 3 in the receiver according to the present invention.

FIG. 2 is a block diagram showing the configuration of the tuning control section 3 in the receiver according to the present invention.

The tuning control unit 3 includes a master clock generating section 6, a VCO counter 7 constituting a frequency control loop, a frequency difference detector 8 and a digital charge pump 9 and a D/A converter 10.

The tuning control section 3 further includes means for temporarily holding an input storage instructing signal or read designating signal, and a frequency division ($M_i$) storage unit 11a. The frequency division ($M_i$) storage unit 11a operates, when the storage instructing signal is inputted, so as to store the tuning frequency information included in the storage instructing signal, i.e., frequency division data $M_i$ at the address designated by the address designation information (ADDRESS) also included in the storage designating signal, and when the read instructing signal is inputted, so as to output the frequency division data $M_i$ designated by the address designation information (ADDRESS) also included in the read instructing signal.

The tuning control section 3 further includes a synchronizing control unit 12 for controlling the operation of the respective components in response to an input signal and a lock detector 13 for judging whether or not the frequency difference acquired by the frequency difference detector 8 is within a predetermined range.

The digital charge pump 9 includes a latch means 14 and a adder/subtracter 15 for addition and subtraction.

An explanation will be given of storage processing and read processing using the tuning control section 3.

The storage processing is carried out using the tuning control section 3 as follows. Where an optional frequency division data $M_i$ is to be stored in the $M_i$ storage unit 11a of the tuning control section 3, the storage instructing signal as shown in FIG. 3B is sent from the control unit 2 to the tuning control unit 3.

Figure 3A:
FIGS. 3A to 3C are views showing an instructing signal by the control section in the receiver in FIG. 1.

The instructing signal used in the present invention, as shown in FIG. 3A, includes a first area (R/W area) where data relative to read/write are stored for discrimination of read/write, a second area (ADDRESS) where address information for designating the write address or read address of the frequency division data $M_i$ relative to the read/write designated by the first area and a third area ($M_i$) where the frequency division data $M_i$ to be transferred when the write data is transferred.

Figure 3B:
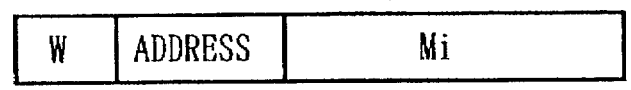

The storage instructing signal, as shown in FIG. 3B, includes the first, second and third areas, all of which are transferred, are supplied with a discrimination signal (W signal) indicative of write (WRITE), address information (ADDRESS) indicative of the write address, and information of the frequency division data ($M_i$) to be written.

The storage instructing signal outputted from the control section 2 is once held in the holding means 1 of the tuning control unit 3. On the other hand, the control unit 2 supplies an end completion signal (END signal) indicative of the end of data transmission to the synchronizing control unit 12. The synchronizing control unit 12, in response to the end discrimination data, reads the data of the first area to control the respective components totally as described below. Namely, the end discrimination signal is a reference for the operation of the synchronizing control unit 12.

The synchronizing control unit 12, in response to the fact that the first area is a write signal (W signal), controls the address information and frequency division data $M_i$ held in the holding means 11 so that they are transferred to the $M_i$ storage section 11a.

The $M_i$ storage unit 11a includes a plurality of storage areas and holds the input frequency division data $M_i$ in the storage area designated by the input address information.

On the other hand, by the following tuning operation, the synchronizing control unit 12 determines the control value of the VCO 4a corresponding to the frequency division data $M_i$ stored in the $M_i$ storage area 11a and the determined control value at the corresponding address digital in the charge pump 9.

Now assuming that the present oscillating frequency of the VCO 4a is fvco and taking an example of determining and storing the control value of the VCO 4a for outputting the oscillating frequency fvco corresponding to the frequency division data $M_i$ newly held at the address designated by the control section 2, the tuning operation in storage processing of the tuning control section 3 according to the present invention will be explained with reference to the timing chart of FIG. 4.

Where the first area represents a signal indicative of write (write signal), in response to the END signal shown in FIG. 4A, the synchronizing control unit 12 supplies a count pulse having a predetermined pulse width to the VCO counter 7 synchronized with a master clock as shown in FIG. 4B. The predetermined pulse width is decided by the count value of a counter located in the synchronizing control unit 12.

The VCO counter 7 counts the oscillating frequency fvco of the VCO 4a while the count pulse is inputted (i.e. during the high level of the count pulse) to produce the count value $N_i$.

The control unit 12 produces a synchronizing signal as shown in FIG. 4C after the counting operation has been completed. Like the count pulses, the output timing of the synchronizing signal is also managed by the synchronizing control unit 12.

In response to the synchronizing signal, the frequency difference detector 8 acquires a difference between the output $N_i$ of the VCO counter 7 and the frequency division value $M_i$ held in the $M_i$ storage section 11a. Then, the synchronizing control unit 12 controls the $M_i$ storage unit 11a so that the frequency division value $M_i$ is produced.

Specifically, assuming that the pulse width of the count pulse is 1/fr, the count value $N_i$ is represented by $N_i = fvco/fr'$, whereas the frequency division data $M_i$ newly set and held is represented by $M_i = fvco/fr$.

Therefore, $M_i - N_i = (fvco - fvco^-)/fr$. Thus, a difference between the present oscillating frequency $fvco^-$ of VCO and a target frequency fvco can be obtained.

The computing result represents the relationship between $fvco^-$ and fvco which may be positive or negative. Hence, the data $M_i - N_i$ to be outputted is appended with data indicative of plus (+) or minus (−).

The frequency difference computed by a frequency difference detector 8 is supplied to a digital charge pump 9. The digital charge pump 9 includes an adder/subtracter 15 and latching means 14. The digital data corresponding to the present VCO output ($fvco^-$) held in the latch means 14 and the frequency difference data $M_i - N_i$ are added/subtracted by the adder/subtracter 15 under the control of synchronizing control unit 12.

As described above, since the polarity of the computing result can be discriminated, the discrimination data designates whether addition or subtraction should be carried out. In the case of FIG. 4D, since the frequency difference is plus, the addition is carried out.

The computing result (FIG. 4E) of addition or subtraction by the adder/subtracter 15 is held in the storage area of the latch means 14 designated by the input address information and updating of the held data is completed.

The held data corresponding to the input address held by the latching means 14 is converted into an analog voltage TV for actually driving the VCO 4a by a D/A converter 10.

Thus, with updating in the held data as shown in FIG. 4E, the oscillating frequency of the VCO 4a is changed to follow the output from the latch means 14.

On the other hand, the frequency difference $M_i - N_i$ detected by the frequency difference detector 8 is also supplied to the lock detector 13.

The lock detector 13 can be constituted by a counter. It is decided whether or not the input frequency difference $M_i - N_i$ is within a predetermined range (lock range) in synchronism with detection of the frequency difference. Hence, as shown in FIG. 4G, the output of the lock detector 13 is changed into a high level or low level in accordance with the lock or unlock of the lock detector 13.

Specifically, the lock detector 13 is provided to detect whether or not the oscillating frequency of the VCO 4a has reached the vicinity of the target frequency fvco by controlling the oscillating frequency of the VCO 4a by a frequency control loop composed of the VCO counter 7, frequency difference detector 8, digital charge pump 9, D/A converter 10 and VCO 4a.

Until the oscillating frequency of the VCO 4a is stabilized after the oscillating frequency of the VCO 4a has been changed and a wait time (Wt) passes, the synchronizing control unit 12 supplies the count pulse to the VCO counter 7 again.

Then, the oscillating frequency of the VCO 4a has been set again on the basis of the frequency difference $M_i - N_i$ and has reached the vicinity of the target frequency fvco. The frequency difference computed by the frequency difference detector 8 exhibits substantially zero. As shown in FIG. 4D, the output of the frequency difference is changed on the basis of the present detection of the frequency difference.

The frequency difference computed at the present time is within the lock range. The lock detector 13 changes the output into a low level as shown in FIG. 4G to inform the control unit 2 of the locking state.

In response to the input lock signal, the control section 2 detects that the oscillating frequency of the VCO 4a has reached the vicinity of the target oscillating frequency fvco of the VCO 4a by the control of the oscillating frequency of the VCO 4a through the frequency control loop, i.e. recognizes completion of channel tuning. The synchronizing control unit 12 controls the VCO counter 7 at a predetermined timing, and always controls the oscillating frequency of the VCO 4a to reach the target frequency $f_{vco}$.

Thus, the frequency division value $M_i$ designated by the control section 2 and the control voltage information of VCO corresponding to it are correlated with each other at the address also designated by the control section 2, and stored in the corresponding areas of the $M_i$ storage section 11a and the latch means 14.

Figure 3C:
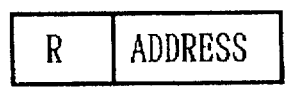

The calling processing of the frequency division value $M_i$ stored by the above storage processing will be explained.

Where the frequency division $M_i$ stored in the tuning control section 3 is to be called for channel tuning, the read instructing signal as shown in FIG. 3C is outputted from the control section 2 to the tuning control section 3.

In the case of the read instructing signal, the first and second areas are transferred but the third area is not transferred. The first and second areas are equipped with a discrimination signal (R signal) indicative of read (READ) and address information (ADDRESS) indicative of a read address.

The read instructing signal is temporarily held in the holding means 11 of the tuning control section 3. On the other hand, the control section 2 supplies an end discrimination signal indicative of completion of data transmission to the synchronizing control unit 12. In response to the end discrimination signal, the synchronizing control unit 12 reads the data of the first area. If the first area is a read signal, the synchronizing control unit 12 totally controls the respective components as follows. Namely, the end discrimination signal constitutes a reference of the operation of the synchronizing control unit 12.

The synchronizing control section 12, in response to the end discrimination signal and the read signal, supplies the address information to the $M_i$ storage unit 11a. The $M_i$ storage unit 11a produces the frequency division value $M_i$ held in the storage area designated by the input address information.

The address information is also supplied to the digital charge pump 9. The synchronizing control section 12 outputs the VCO control value held in the address designated by the input address information from the storage area corresponding area of the latch means 14 of the digital charge pump 9.

An explanation will be given of the concrete tuning operation using the frequency division data $M_i$ stored in the $M_i$ storage area 11a and the corresponding VCO control value stored in the digital charge pump 9.

Now assuming that the present oscillating frequency of the VCO 4a is fvco⁻ and taking an example of tuning the corresponding oscillating frequency fvco at the frequency division data $M_i$ and the control value of the VCO 4a held at the address designated by the control section 2, the tuning operation in read processing of the tuning control section 3 according to the present invention will be explained with reference to the timing charts of FIGS. 5A to 5E.

In the read operation, first, in response to the end discrimination signal (END signal) as shown in FIG. 5A, the tuning control section 3 confirms the signal of the first area of the input signal. Where read is designated by the first area, the digital charge pump 9 produces the VCO control value designated by the input address information as shown in FIG. 5B.

The D/A converter 10 converts the output VCO control value into the voltage value which actually controls the VCO 4a. The converted control voltage value (TV) drives the VCO 4a. The VCO control value, since the control value already converted by the storage processing described above is held at the corresponding address of the latch means 14, is instantaneously converged into the target oscillating frequency fvco the VCO as shown in FIG. 5C.

In parallel to access to the stored data, the synchronizing control unit 12 makes initial setting of setting the output from the lock detector 13 at a high level, i.e., unlock output. This intends to permit the control section 2 to recognize the lock state of the tuning frequency because the tuning using the stored data in this embodiment is carried out at so high a speed that the unlocking signal cannot be detected.

After the oscillating frequency of the VCO 4a has been changed, stabilization of the oscillating frequency of the VCO 4a is awaited. As in the case of the storage processing, the synchronizing control unit 12 supplies a count pulse to the VCO counter 7 (FIG. 5D). Incidentally, the wait time (Wt) is set for a period while the oscillating frequency of the VCO 4a is stabilized.

It is of course that the frequency difference computed by the frequency difference detector 8 is within a lock range so that the output from the lock detector 13 is a signal indicative of a low level (lock state) as shown in FIG. 5E.

The control section 2 recognizes by the input lock signal that the oscillating frequency of the VCO 4a has reached the vicinity of the target frequency fvco.

The synchronizing control unit 12 controls the VCO counter 7 and other components at predetermined timings to control the oscillating frequency of the VCO 4a so that it is always within a lock range through the frequency control loop.

Thus, the read processing described above can realize high speed tuning using the frequency division value $M_i$ and the control value corresponding to it.

In the present invention, the tuning processing using the frequency division value is also carried out in order to restrict the storage capacity for storing the frequency division value $M_i$ and the control value corresponding to it.

In this case, the control unit 2 supplies the storage instructing signal as shown in FIG. 3B to the synchronizing control section 3.

All of the first, second and third areas of the storage instructing signal are transferred as described above. The respective areas are supplied with a discrimination signal (R signal) indicative of READ, address information (ADDRESS) indicative of the read address and frequency division information ($M_i$).

In the normal tuning by the frequency division value $M_i$, the address information is fixed. Specifically, under the control by the synchronizing control unit 12, the input frequency division value $M_i$ is stored at the address set for normal tuning of the $M_i$ storage 11a, and the control value of the VCO 4a is stored at the address set for normal tuning of the latch means 14. The various kinds of other processing are the same as in the case of the storage processing.

Figure 6A:
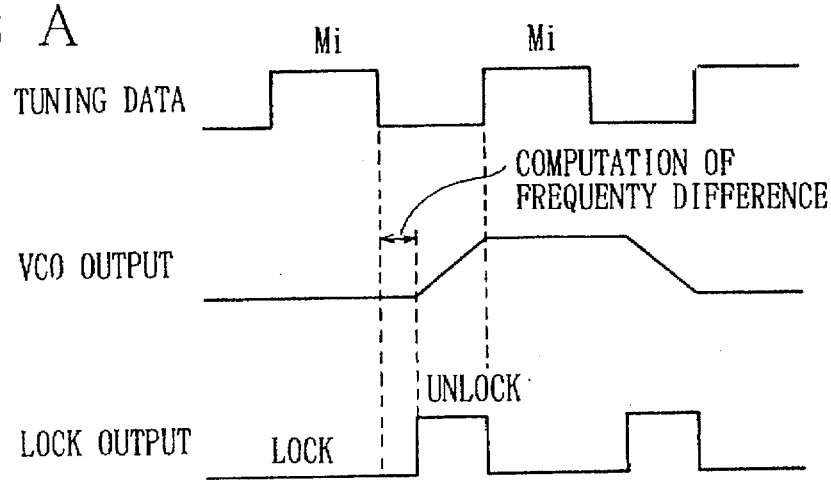
FIGS. 6A, 6B and 6C are timing charts showing the tuning times in the receiver in FIG. 1.
Figure 6B:
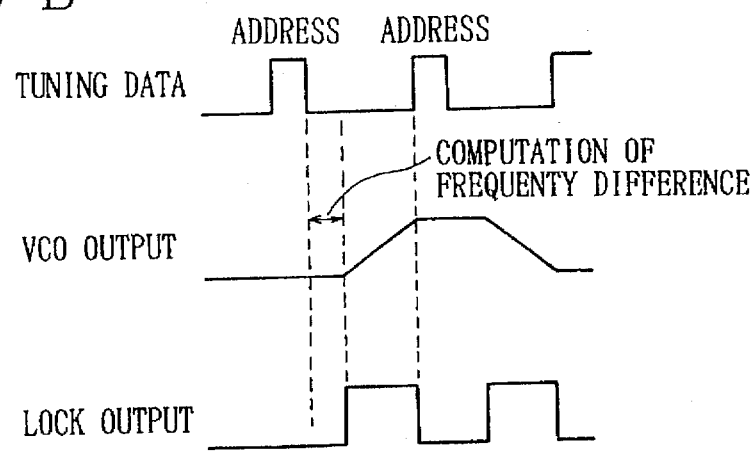
Figure 6C:
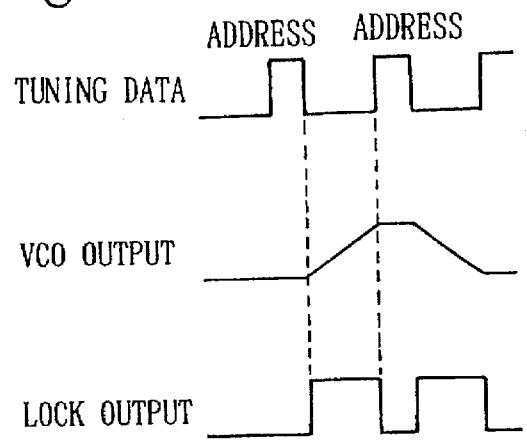

FIGS. 6A to 6C show comparison results between the tuning time of the receiver which continuously transfers the frequency division value $M_i$ and that of the receiver designating the addresses.

FIG. 6A shows the tuning time when the plural tuning processes are carried out simultaneously on the basis of the conventional transfer format having single processing from transmission of the frequency division data $M_i$ to lock detection by the tuning process by the above frequency division value $M_i$ using the tuning control unit 3 according to the present invention.

FIG. 6B shows the tuning processing of the receiver addressed according to the present invention assuming that the frequency division value $M_i$ is stored previously.

The address, if there are four storage addresses, can be represented by 2 bits. Therefore, the present invention can shorten the tuning time as compared with the transfer of the frequency division data $M_i$ composed of a large number of bits. The difference is remarkable in continuous receiving processing. It should be noted that in FIG. 6B, the control data for the VCO is not stored.

FIG. 6C shows the tuning processing of the receiver addressed according to the present invention assuming that the control value data are previously stored in correlation with the frequency division data $M_i$. In this case, it can be seen that since the control value data are also stored previously, the time of computing the frequency difference is reduced to shorten the tuning time further.

Figure 7A:
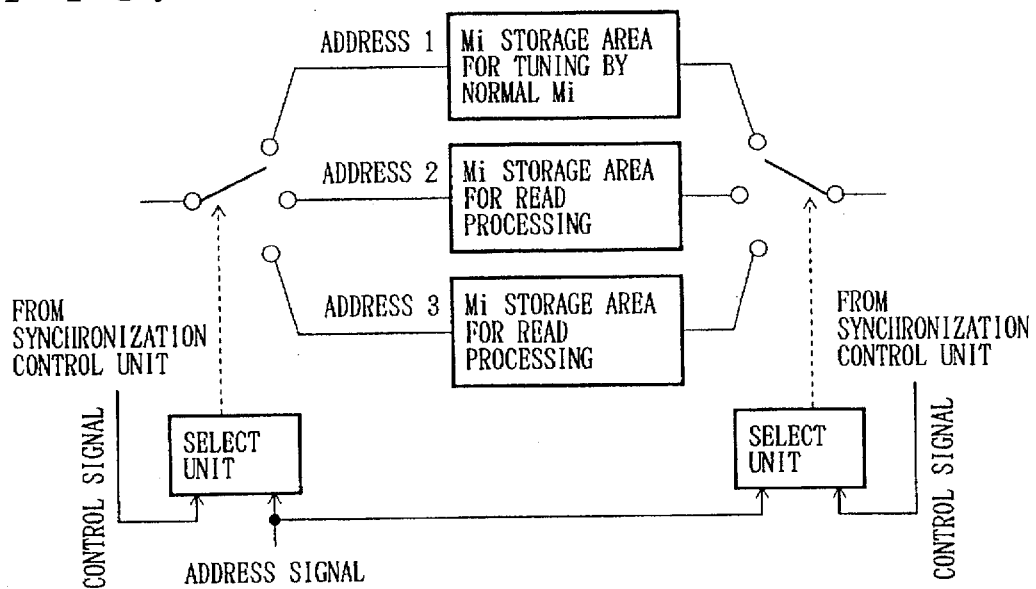
FIGS. 7A and 7B are views showing a concrete configuration of the $M_i$ storage unit and a latching means of the receiver in FIG. 1.
Figure 7B:
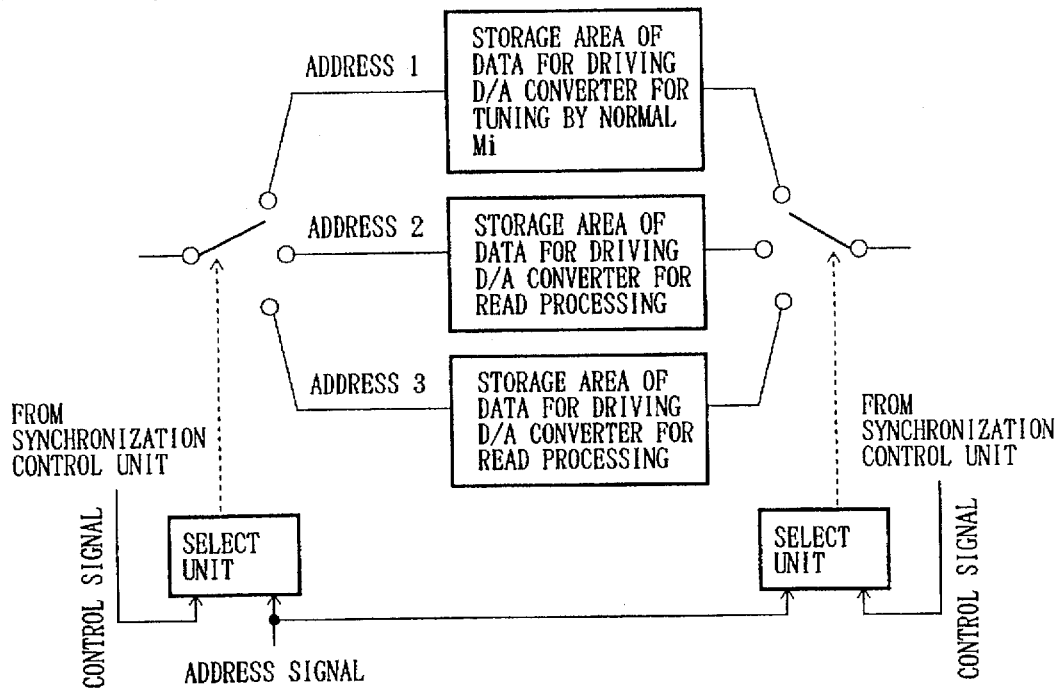

FIGS. 7A and 7B show concrete configurations of the $M_i$ storage unit 11a and latch means 14 according to the present invention.

FIG. 7A shows the configuration of the $M_i$ storage unit 11a. The storage unit 11a is composed of a storage area of the frequency division value $M_i$ for normal tuning by the above frequency division value $M_i$ and another area of the frequency division value $M_i$ used for the above storage/read processing. In FIG. 7A, the storage area corresponding to the frequency division value $M_i$ corresponding to address No. 1 is a storage area of the frequency division value $M_i$ prepared for normal tuning, whereas the storage areas corresponding to address No. 2 et seq. are storage areas of the frequency division value $M_i$ prepared for storage/read in the present invention.

The synchronizing control unit 12 produces the control signal based on the signal for discriminating the first area input. Using the control signal supplied to the $M_i$ storage unit 11a and the address information of the second area input, the frequency division value $M_i$ to be stored and that of the frequency division value $M_i$ to be read are defined by a selecting unit constructed by a logic circuit.

FIG. 7B shows the configuration of the latch means 14. The storage area includes a storage area of the data for driving the D/A converter 10 for normal tuning by the frequency division value $M_i$ and another storage area of data for driving the D/A converter 10 used for the above storage/read. In FIG. 7B, the storage area corresponding to address No. 1 is a storage area of the data for driving the D/A converter 10 for normal tuning of the frequency division value $M_i$, whereas the storage areas corresponding to address 2 et seq. are storage areas of the data driving the D/A converter 10 for read/write processing.

The synchronizing control unit 12 produces the control signal based on the discrimination signal for the input first area. The control signal and address information of the second area defines the storage area of the data for driving the D/A converter to be stored by the selection section of a logic circuit and that of the data for driving the D/A converter 10 for be read.

Further, since the storage addresses of the $M_i$ storage section 11a and the latch means 14 are defined by the input address information, in the storage processing, the frequency division value and the corresponding VCO control value are stored in the storage area designated by the same address, whereas in the read processing, those designated by the same address are read.

ASPECT 2

Now referring to the drawings, an explanation will be given of embodiments according to the second aspect of the present invention described above.

Figure 8:
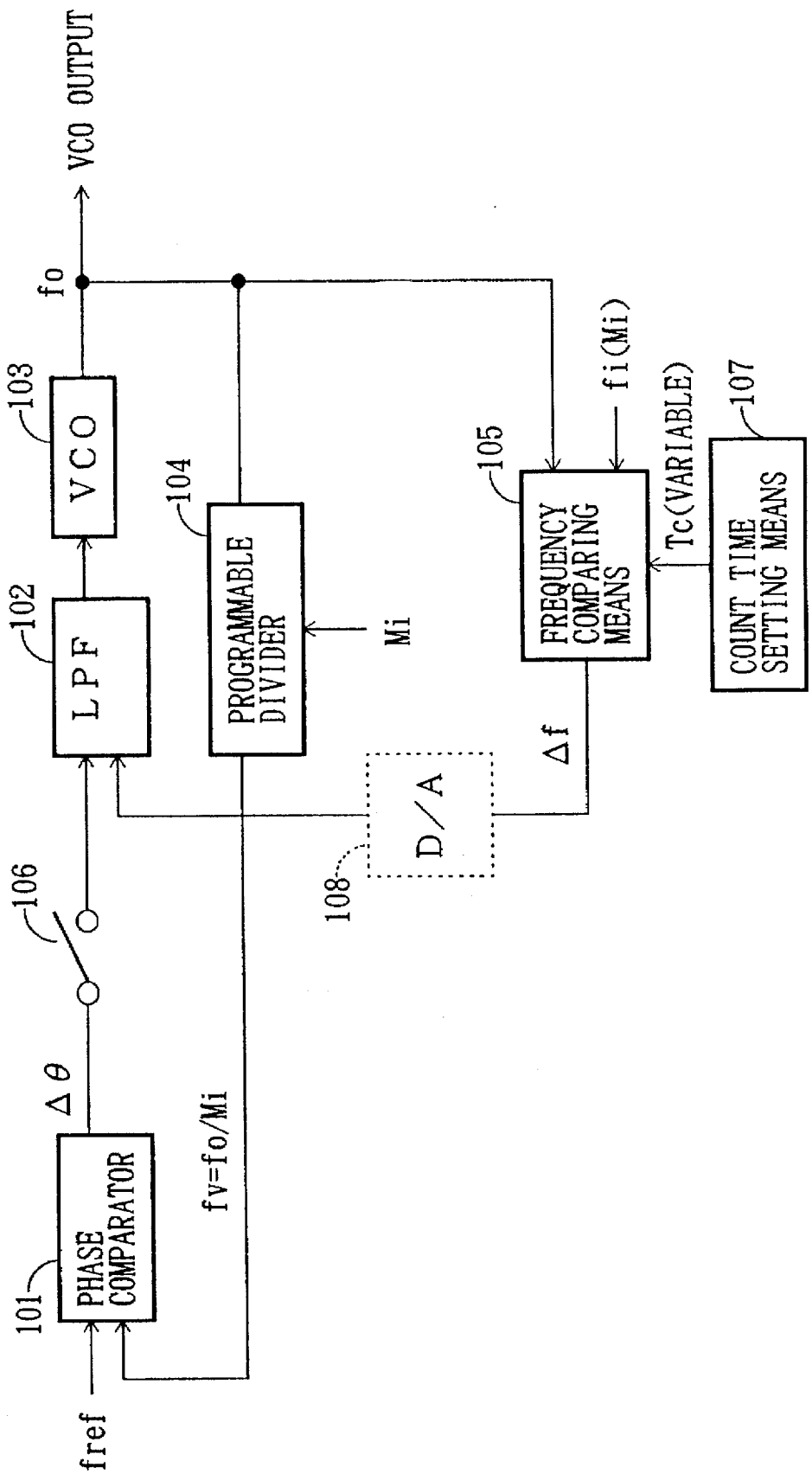
FIG. 8 is a block diagram showing the theory of a PLL used in the frequency synthesizer tuner according to the second aspect of the present invention.
Figure 20:
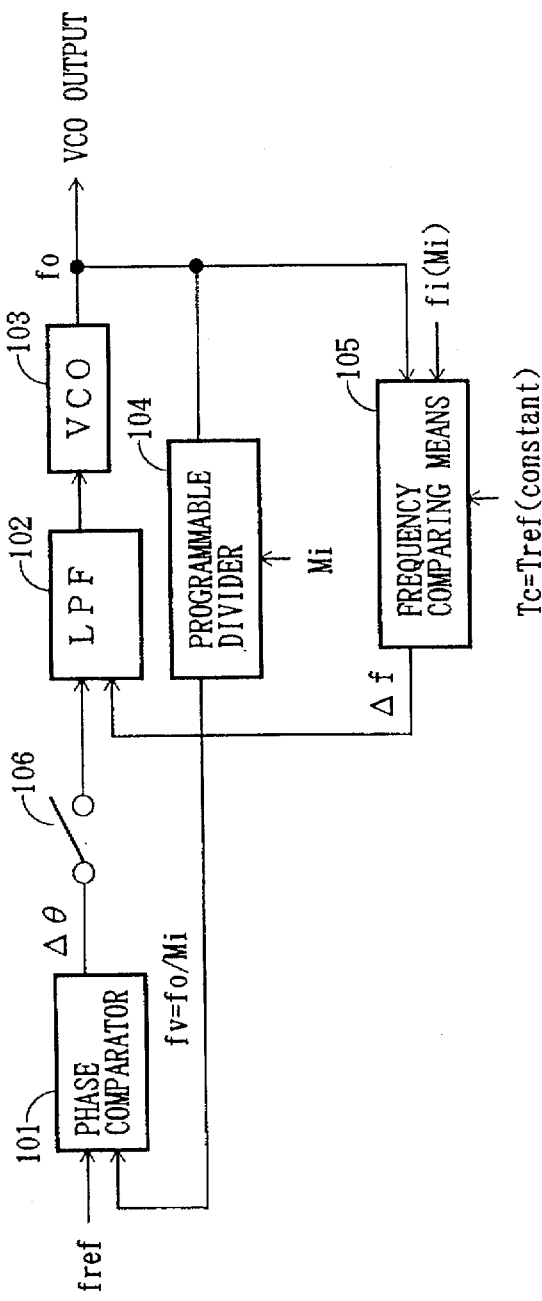
FIG. 20 is a block diagram showing the principle of the PLL circuit used in another conventional frequency synthesizer tuner.
Figure 21:
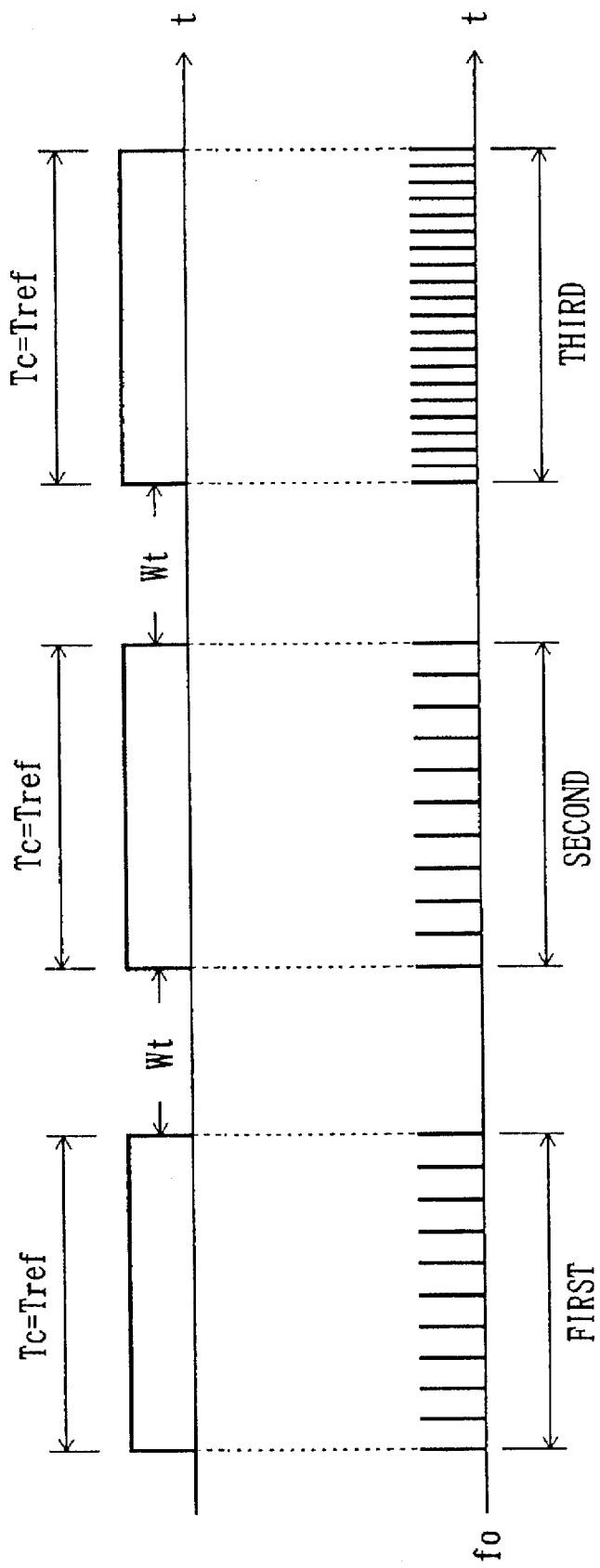
FIG. 21 is a timing chart for explaining the counting operation the PLL circuit in FIG. 20.

FIG. 8 is a block diagram of the theoretical configuration of the PLL circuit used in the frequency synthesizer tuner according to the present invention. Referring to FIG. 8, an explanation will be given of the means adopted to solve the problem relative to the second aspect described above. In FIG. 8, like reference numerals refer to like parts in FIG. 20.

The second aspect of the present invention relates to a frequency synthesizer tuner comprising a frequency comparing means 105 for acquiring a signal indicative of a frequency difference $\Delta f$ between a target tuning frequency $f_i$ and an oscillating frequency $f_0$ of VCO 103; a frequency comparison loop for feeding back the acquired frequency difference signal $\Delta f$ to the VCO 103 to control the oscillating frequency $f_0$ of the VCO 103 so that the tuning frequency $f_i$ is adjusted; and a count time setting means 107 for setting the count time $T_c$ for measuring the oscillating frequency of the VCO 103 used by the oscillating comparison means 105, wherein the count time $T_c$ is increased whenever measurement of the oscillating frequency of the VCO 103 is repeated by the frequency comparison means 105.

As described above, it is difficult to cause the oscillating frequency $f_0$ of the VCO 3 to approach the target tuning frequency $f_i$ with high accuracy by the one round detection of frequency difference using the frequency comparing loop. In view of this fact, it is not desired to detect the frequency with high accuracy from the start with the count time lengthened. Alternatively, the total time taken for the oscillating frequency $f_0$ of VCO 103 to reach the target tuning frequency $f_i$ can be shortened by increasing the count time $T_c$ gradually in such a manner that at the first time, the frequency difference is detected for a short time with the count time $T_c$ shortened, and at the second detection of frequency difference, the count time is made longer than the first detection to enhance the accuracy.

For this purpose, in accordance with the present invention, the count time setting means 107 which can vary the count time $T_c$ is provided to increase the count time $T_c$ whenever the count operation is repeated by the said frequency comparing means 105.

Figure 9:
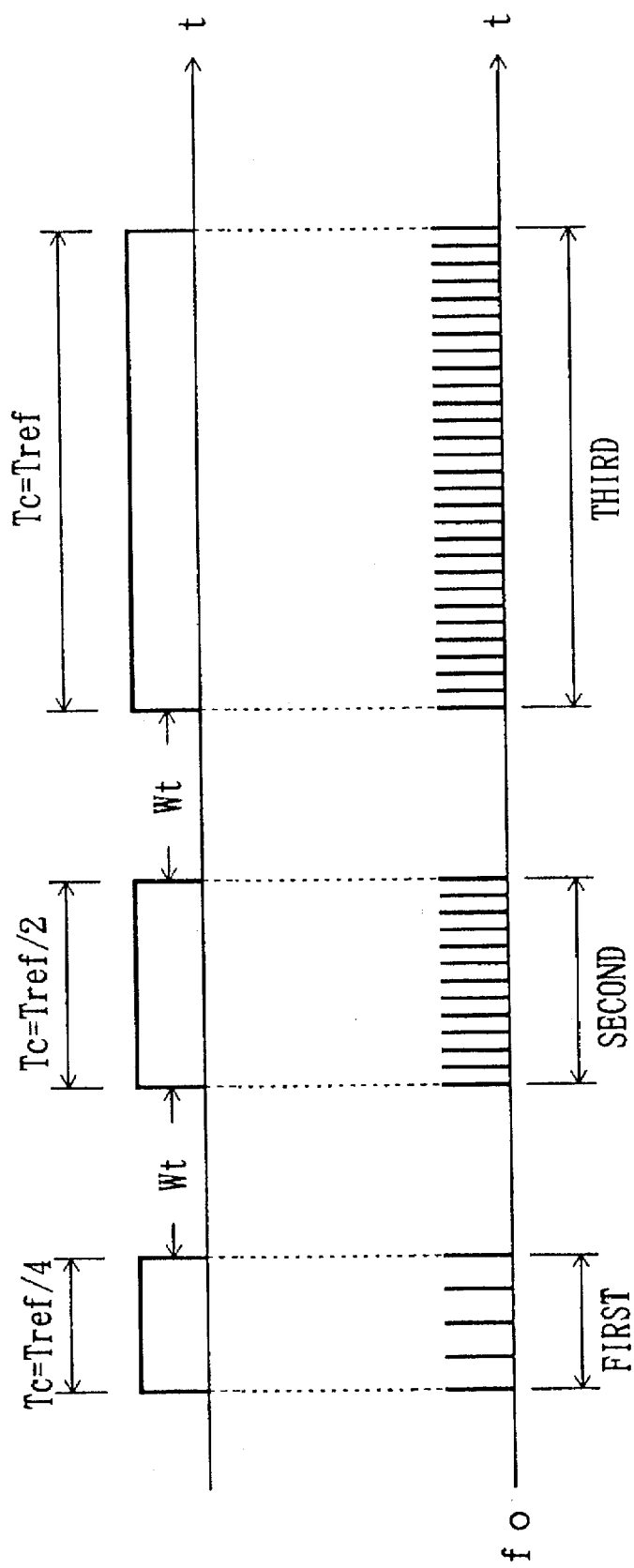
FIG. 9 is timing chart of the counting operation in the frequency synthesizer tuner in the circuit in FIG. 8.

In such a configuration, as shown in FIG. 9, it is assumed that by the operation of three-times detection of frequency difference, the oscillating frequency of VCO 103 has reached the target tuning frequency $f_i$. The count time is set at the first time $T_c = \frac{1}{4} \cdot T_{ref}$, at the second time $T_c = \frac{1}{2} \cdot T_{ref}$ and at the third time $T_c = T_{ref}$. The total time taken for the three times of count operation is $(\frac{1}{4} \cdot T_{ref} + \frac{1}{2} \cdot T_{ref} + T_{ref}) = 1.75 T_c$ except the wait times $W_r$. On the other hand, in the prior art, the total time taken for the three-times of count operation is $3T_c$. The present invention permits the oscillating frequency of the VCO 103 to be coincident with the target tuning frequency $f_i$.

In the above frequency synthesizer tuner, at least the frequency comparison means 107 is preferably constituted as a digital circuit, and a D/A converter 108 (encircled by dotted line in FIG. 8) is preferably provided at the output of the frequency comparing means 107 so that the input/output conversion characteristic of the D/A converter 108 is the same as the voltage—frequency characteristic of the VCO 103.

As described above, in the frequency control by the frequency comparing loop, in order to acquire the frequency difference from the target tuning frequency $f_i$, the oscillating pulses of the VCO 103 must be counted. This counting processing can be more easily carried out by a digital circuit than an analog circuit. For this reason, in many cases, the frequency comparing means 105 is constituted by the digital circuit. In this case, for coincidence of signal format with the LPF 102 which is an analog circuit receiving the output from the frequency comparison means, a D/A converter 108 indicated by a block of dotted line in FIG. 8 is provided on the output side of the frequency comparison means 105.

Figure 10:
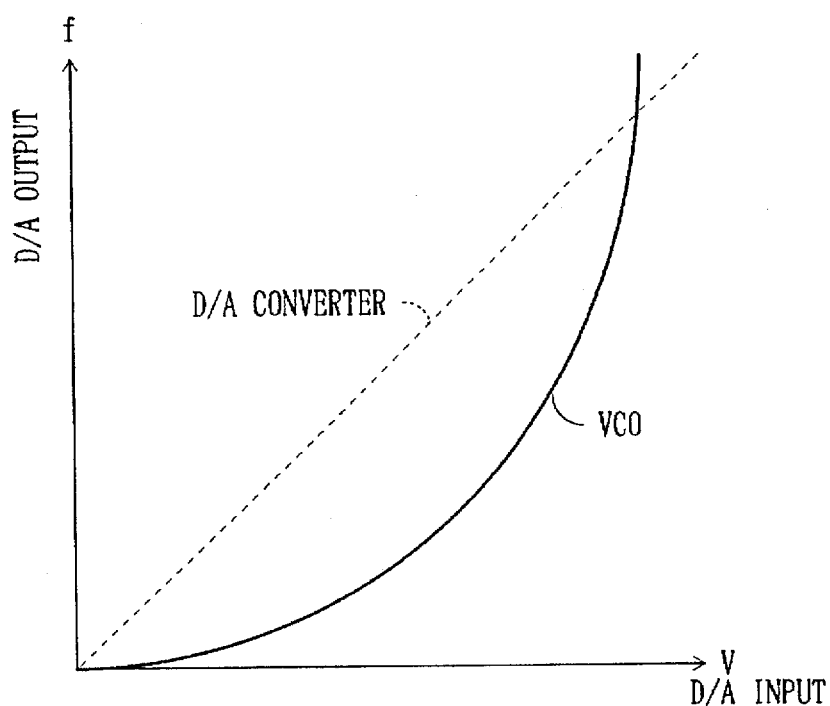
FIG. 10 is a graph showing the conversion characteristics in a VCO and D/A converter.

Meanwhile, the D/A converter used in an acoustic device such as a radio receiver is caused to have a linear input/output conversion characteristic indicated by dotted line in FIG. 10. But, the VCO 103 is commonly a non-linear element whose V (voltage)—f(frequency) characteristic is non-linear indicated by solid line in FIG. 10. Therefore, provision of the D/A converter 108 having the linear conversion characteristic gives rise to an error due to the difference in conversion characteristic. A redundant time will be spent until the oscillating frequency $f_0$ will be converged into the target tuning frequency $f_i$. For this reason, in the present invention, the input/output conversion characteristic of the D/A converter 108 is made the same as the V–f characteristic of the VCO 103. Such a configuration can remove the error due to the difference in conversion characteristic, thus enhancing the conversion accuracy to this degree. Thus, the time taken for the oscillating frequency $f_0$ of the VCO 103 to converge into the target frequency $f_i$ can be further shortened.

Now referring to the drawings, an explanation will be given of more concrete embodiments of the second aspect of the present invention.

Figure 11:
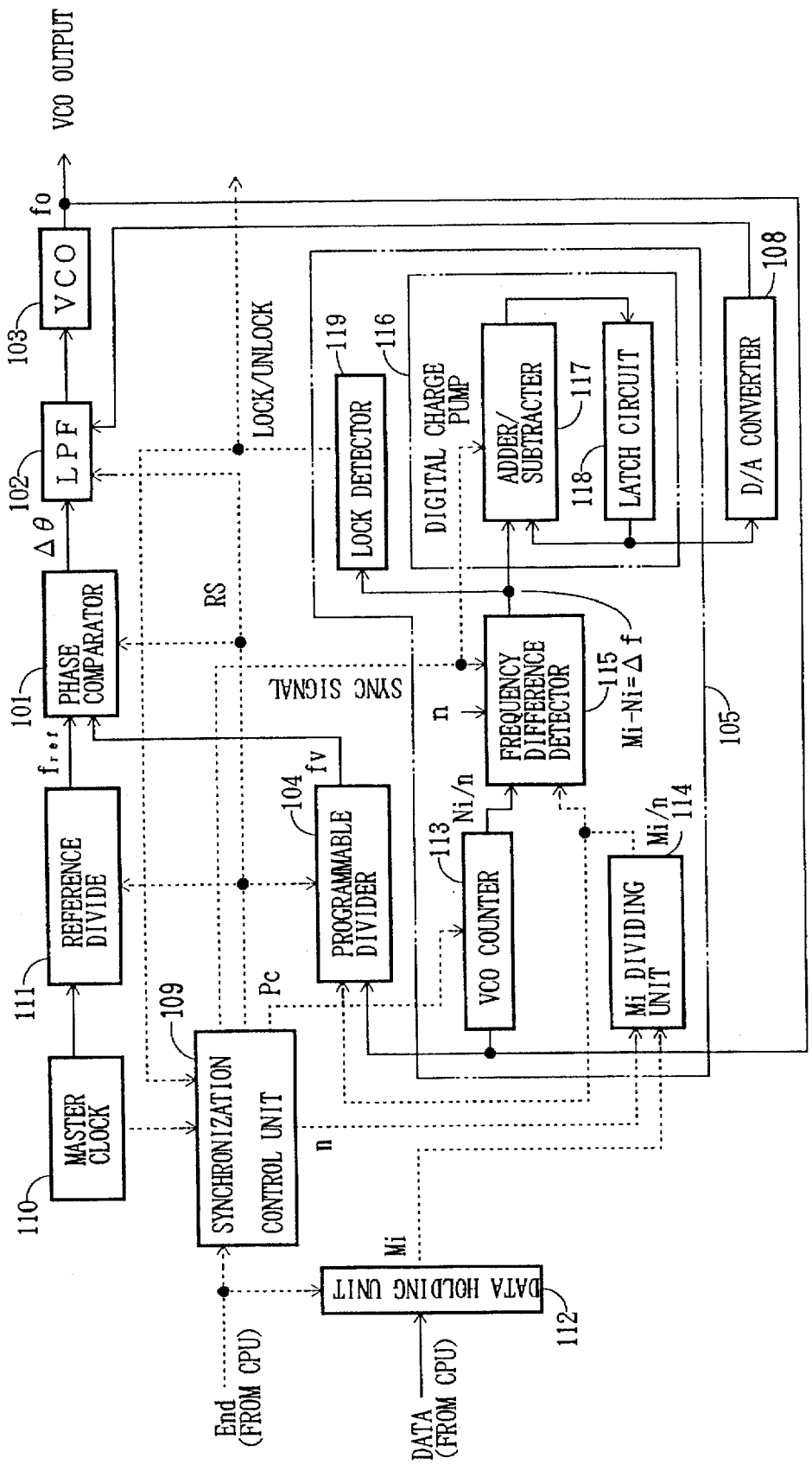
FIG. 11 is a block diagram showing one example of the PLL circuit in the frequency synthesizer tuner in FIG. 8.

FIG. 11 shows an example of the PLL in the frequency synthesizer tuner according to the second aspect of the present invention. In FIG. 11, like reference numerals refer to like elements in FIG. 8.

Figure 15:
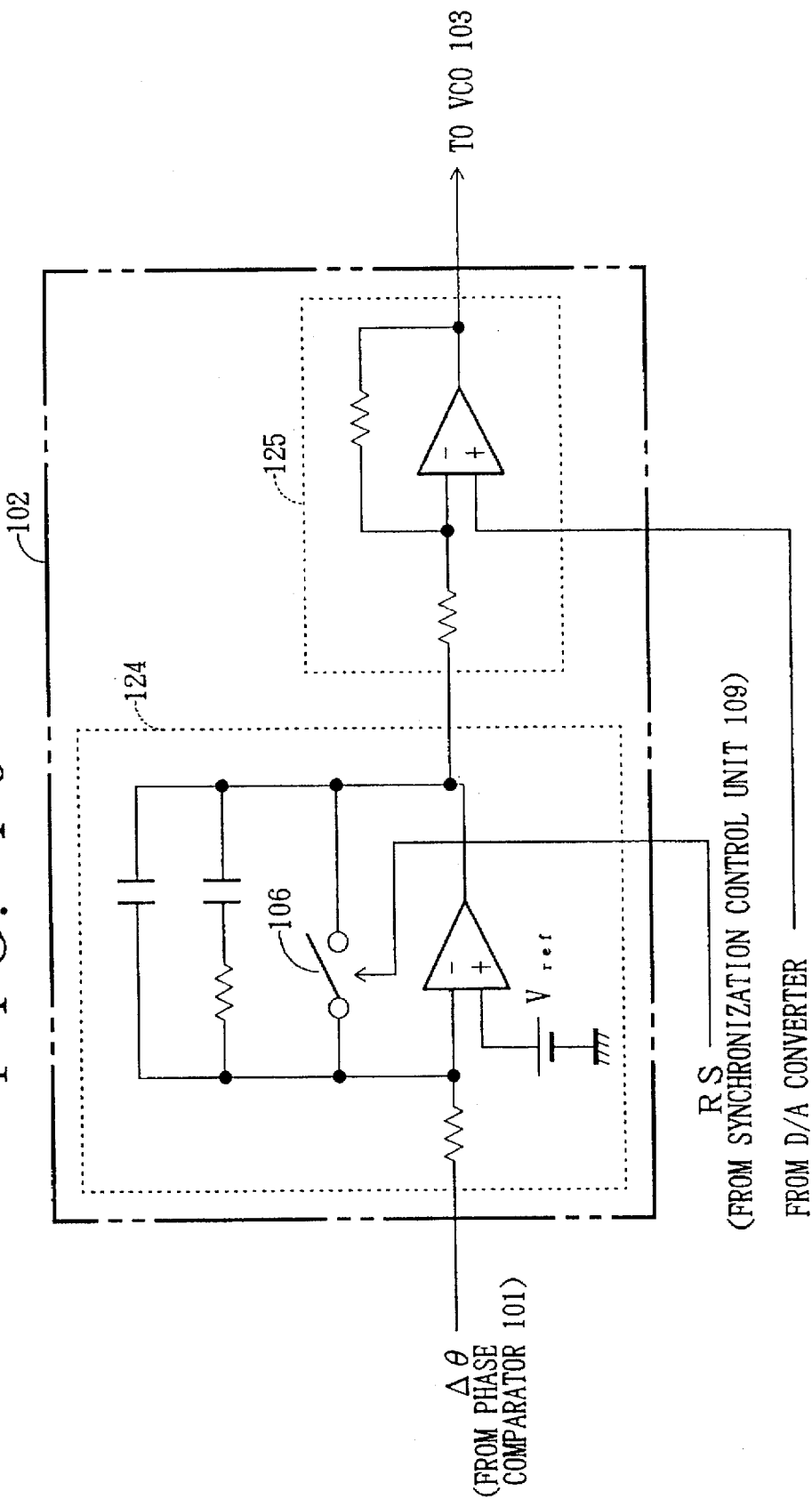
FIG. 15 s a concrete example of the LPF 102 in FIG. 11.

In FIG. 11, the PLL circuit includes a phase comparator 101, an LPF 102, a VCO 103, a program divider 104 constituting a frequency divider 104, a frequency comparing means 105, a D/A converter 108, a synchronizing control unit 109, a master clock oscillator 110 and a data holding unit 112. The synchronizing control unit 109 also serves as the count time setting means 107. A switch for conversion from the frequency comparison loop into the phase comparison loop is incorporated in the LPF 102 the concrete example of which is shown in FIG. 15. The frequency comparison means 105 includes a VCO counter 113 which counts the oscillating frequency of VCO 103 on the basis of the count pulse time $P_c$ sent from the synchronizing control unit 109, an $M_i$ division section 114 for 1/n dividing the frequency division value $M_i$ for setting the tuning frequency $f_i$ sent from the data holding unit 112, a frequency difference detector 115 for taking subtraction between the frequency division value $M_i/n$ sent from the $M_i$ division section 114 and the pulse count value $N_i$ of the VCO 103 sent from the VCO counter 113, an adder/subtracter 117 and a latch circuit 118 constituting the digital charge pump 116, and a lock detector 119 for detecting substantial coincidence between the oscillating frequency $f_0$ of the VCO 103 and the tuning frequency $f_i$.

Concrete examples of the $M_i$ division section 114 and the frequency difference detector 115 will be described later (see FIGS. 13 and 14).

The synchronizing control unit 109, under the control of CPU (not shown), creates a pulse $P_c$ with a pulse width of $T_c$ which is 1/n ($n \leq 1$) of reference period $T_{ref}$ using a master clock from the master clock oscillator 110 and supplies it to the VCO counter as a count time pulse Pc, and also produce various control signals inclusive of a reset signal RS, the frequency division value n of the count time pulse $P_c$ and a synchronizing signal.

The reference divider 111 divides the master clock produced by the master clock oscillator 110 into a reference pulse having a reference frequency $f_{ref}$ to be produced. The data holding section 112 is a circuit such as a shift register for storing and holding the frequency division value $M_i$ for setting the target tuning frequency $f_i$. The frequency division value $M_i$ is transferred from the CPU (not shown).

Referring to the timing chart of FIG. 12, an explanation will be given of the operation of the above circuit of FIG. 11 in connection with an example in which the oscillating frequency of the present oscillation frequency $f_0=f_i'$ into a new tuning frequency $f_i$ instructed by the CPU.

First, in order to convert the oscillating frequency of the VCO 103 into $f_0=f_i$, the frequency division value $M_i$ providing the new tuning frequency $f_i$ is supplied to the data holding unit 112 from the CPU (not shown) and stored there. Further, the CPU not shown supplies to the synchronizing control unit 109 an end discrimination signal indicative of end of the data transmission as shown in FIG. 12A. In response to the end discrimination signal End, the synchronizing control section 109 starts the operation of varying the oscillation frequency of the VCO 103 controlling the respective constituent circuit units as follows.

In synchronism with the end discrimination signal End, the synchronization control unit 109 produces the reset signal RS as shown in FIG. 12H. This reset signal RS is a signal for converting the control of the PLL circuit to the side of frequency comparison loop. While the reset signal RS is at "H" level, the operation of the reference divider 111, programmable divider 104 and the phase comparator 101 is stopped.

In response to the end discrimination signal End, the synchronizing control unit 109 sends to the VCO counter 113 the first count time pulse $P_c$ having a pulse width of $1/n \cdot T_{ref}$ resulting from n division of the reference period $T_{ref}$ and supplies this division value to the $M_i$ division unit 114.

For example, assuming that n=2 for the first count operation, the synchronizing control unit 109 creates the count time pulse $P_c$ having a pulse width of $T_c=1/n \cdot T_{ref}=\frac{1}{2} \cdot T_{ref}$ to be supplied to the VCO counter 113 and sends n=2 to the $M_i$ division unit 114.

The VCO counter 113 counts the number of oscillating pulses supplied from the VCO 103 and supplies the pulse count value $N_i/n$ to the frequency difference detector 115. Specifically, assuming that the pulse count value of the oscillating output from the VCO 103 is $N_i$ during the reference period $T_{ref}$ which corresponds to the pulse width $T_c$ of the count time pulse $P_c$, the pulse count value when it is counted by the count time pulse $P_c$ having a pulse width of the above $T_c=1/n \cdot T_{ref}$ is $N_i/n$. Thus, the VCO counter 113 supplies the pulse count value $N_i/n$ to the frequency difference detector 115.

On the other hand, in response to the frequency division value n of the count time pulse $P_c$ from the synchronizing control unit 109, the $M_i$ division section 114 divides the frequency division value $M_i$, providing the target tuning frequency $f_i$ sent from the data holding section 112, by this value of n thereby converting the frequency division value $M_i$ into the count pulse value $M_i/n$ having the tuning frequency $f_i$ corresponding to the present count time $T_c$. The count pulse value is sent to the frequency difference detector 115.

The frequency difference detector 115 takes subtraction between the pulse count value $M_i/n$ having the target frequency $f_i$ sent from the $M_i$ division unit 114 and the pulse count value $N_i/n$ having the present oscillating frequency sent from the VCO counter 113, thus acquiring the difference value $(M_i/n)-(N_i/n)$. The frequency difference $\Delta f$ obtained by multiplying the difference value $(M_i/n)-(N_i/n)$ by n will be supplied to the charge pump 116.

The reason why the difference value $(M_i/n)-(N_i/n)$ is multiplied by n is as follows. Since the difference value $(M_i/n)-(N_i/n)$ is a frequency difference during 1/n of the reference period $T_{ref}$ it is 1/n of the inherent frequency difference $\Delta f$ when counted during the reference period $T_{ref}$. For this reason, the difference value $(M_i/n)-(N_i/n)$ is multiplied by n to be restored to the inherent frequency difference $\Delta f=M_i-N_i$ to be outputted.

Thus, the frequency difference $\Delta f$ $M_i-N_i$ can be obtained in a short count time $T_c$ which is 1/n when counted during the reference period $T_{ref}$ but with deteriorated accuracy.

The digital charge pump 116 includes the adder/subtracter 117 and the latch circuit 118. The adder/subtracter 117 carries out the addition/subtraction between the present oscillating frequency $f_0$ of the VCO 103 held in the latch circuit 118 and the frequency difference $\Delta f$ supplied from the frequency difference detector 115. The frequency data obtained as a result of the addition/subtraction is held in the latch circuit 118. The frequency difference $\Delta f$ supplied from the frequency difference detector 115 is a positive or negative value. The positive value is added to the oscillating frequency $f_0$ whereas the negative value is subtracted from the oscillating frequency $f_0$. The result of addition or subtraction is shown in FIG. 12E (it should be noted that FIG. 12E shows the case of addition.

The frequency data after addition/subtraction newly held in the latch circuit 118, which is an analog signal, is converted into a digital signal in the D/A converter 108. The digital signal thus obtained is applied to the VCO 103. As a result, the oscillating frequency of the VCO 103 abruptly varies from the present oscillating frequency $f_i'$ toward the target frequency $f_i$ as shown in FIG. 5F.

Meanwhile, the VCO 103 constitutes a resonating circuit including a varicap, a capacitor, a coil, etc. The oscillating frequency of the VCO 103, therefore, cannot be varied instantaneously, but gradually varied toward the target frequency at a time constant defined by the circuit. If the next count operation is started before the varying oscillating frequency of the VCO 103 is stabilized, correct frequency control cannot be carried out.

In order to obviate this inconvenience, the synchronization control unit 109 creates a wait time $W_r$ so as to stop the next count operation until the oscillating frequency of the VCO 103 is stabilized, and as shown in FIG. 10B, operates to produce a next count time pulse $P_c$ after passage of the wait time $W_r$.

On the other hand, the frequency difference $\Delta f$ acquired by the frequency difference detector 115 is also supplied to the lock detector 119. The lock detector 119 which can be constituted by a counter decides whether or not the supplied frequency difference $\Delta f$ is within a predetermined lock range, i.e., the oscillating frequency of the VCO 103 has substantially agreed with the target tuning frequency $f_i$. The lock detector 119 produces an "H" level signal indicative of the unlock state if the oscillating frequency is not within the lock range, whereas it produces an "L" level signal indicative of the lock state if the oscillating frequency is within the lock range.

After passage of the wait time $W_r$, the synchronizing control unit 109 produces a count time pulse $P_c$ for the second count operation as shown in FIG. 12B. Then, because of the frequency comparison operation at the first time, the oscillating frequency of the VCO 103 is already very close to the target tuning frequency $f_i$ as shown in FIG. 5F. For this reason, in the second count operation, in order to enhance the accuracy of detecting the frequency for correct frequency control, the pulse width of the count time $P_c$ is made longer than in the first count operation. In the example shown, in second time the count operation, n is set at 1 (n=1). Namely, in the second time count operation, the synchronizing control unit 109 produces a count time pulse $P_c$ having a pulse width ($T_c=T_{ref}$) twice as long as that in the first count operation.

The count pulse $P_c$ is sent to the VCO counter 113. The $M_i$ division unit 114 divides $M_i$ by the frequency division value of the count time pulse $P_c$ and supplies the value $M_i/n$ to the frequency difference detector 115. In the manner similar to the first count operation, the oscillating frequency of the VCO counter 103 is counted, and the frequency difference $\Delta f$ is computed by the frequency difference detector 115. Thus, the frequency of the VCO 103 is controlled.

The second count operation, in which the pulse width of the count time pulse $P_c$ is twice as long as that in the first count operation, requires a time twice as long as that in the first count operation, but can be performed with the accuracy of detection twice that in the first count operation. Thus, as a result of the frequency control based on the second count operation, the oscillating frequency $f_0$ of the VCO 103 becomes approximately equal to the target tuning frequency $f_i$ as shown in FIG. 12F.

However, in the example at issue, as shown in FIG. 12D, the frequency difference $\Delta f$ is not yet within the lock range. For this reason, the synchronizing control unit 109 produces a count time pulse $P_c$ having a pulse width $T_c=T_{ref}$ so that the oscillating frequency of the VCO 103 is controlled.

As a result of the third count operation, as shown in FIG. 12D, the frequency difference $\Delta f$ is within the lock range so that the oscillating frequency $f_0$ of the VCO 103 becomes approximately equal to the target tuning frequency $f_i$. The lock detector 119 detects this fact and exchanges its output level from the "H" level into the "L" level indicative of the lock state. The lock detector 119 sends this signal to the synchronizing control unit 109 and the required constituent circuits.

Figure 19:
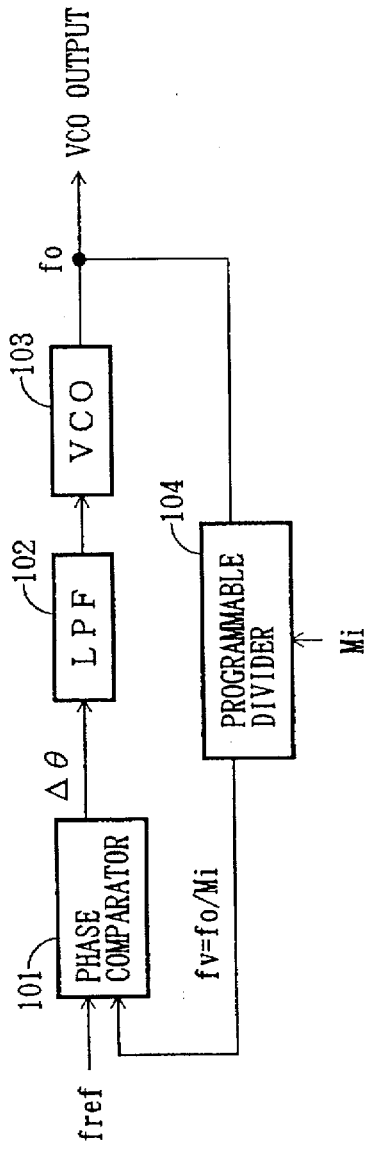
FIG. 19 s a block diagram showing the principle of the PLL circuit used in a conventional frequency synthesizer tuner.

In response to the lock detection signal from the lock detector 119, the synchronizing control unit 109 exchanges the reset signal RS from the "H" level to the "L" level as shown in FIG. 12H. This starts the operation of the phase comparator 101 and turns on the switch 106 incorporated in the LPF 102 (FIG. 19). The LPF 102 is set in a status permitting reception of a phase difference signal $\Delta\theta$ from the phase comparator 101 also. Further, the reference divider 111 and program divider 104 which have stopped hitherto start the operation for frequency division so that the control using the phase comparison loop is started in place of the frequency comparison loop.

When the control using the phase comparison loop is started, the oscillating frequency $f_0$ of the VCO 103 is adjusted finely on the basis of the phase difference signal $\Delta\theta$. Accordingly, the oscillating frequency $f_0$ of the VCO 103 is converged into the status completely synchronized with the target frequency $f_0$.

As described hitherto, in accordance with the second aspect of the present invention, since the count time $T_c$ is gradually lengthened with an increment in the number of the counting operation, the oscillating frequency $f_0$ can reach the tuning frequency $f_i$ in a very short time. The lock up time of the PLL circuit can be shortened correspondingly.

In the present invention, simultaneously when the frequency comparison loop is exchanged into the phase comparison loop, as shown in FIGS. 12I and 12J, the frequency operation of the reference divider 111 and program divider 104 are started. In this way, the phase error in the above exchange can be reduced, thus leading the PLL circuit into a synchronizing state.

The frequency comparison loop intends to control the oscillating output of the VCO 103 on the basis of the frequency difference $\Delta f$, whereas the phase difference comparison loop intends to control the oscillating output of the VCO 103 on the basis of the phase difference $\Delta\theta$. Both are operated on the basis of entirely different control theories. Therefore, even if the frequencies of the comparison signals $f_{ref}$ and $f_v$ inputted to the phase comparator 101 are equal, inadvertent exchange from the control by the frequency comparison loop to that by the phase comparison loop will provide a phase difference between both signals as a phase error.

In order to obviate such inconvenience, when control is exchanged from the frequency comparison loop to the phase comparison loop, as shown in FIGS. 12I and 12J, the frequency division operation of the reference divider 111 and the program divider 104 are also started. Thus, the phase difference in the above exchange can be removed. This shortens the time to the phase synchronization of the both signals, and can also shorten the lockup time.

FIG. 13 shows a typical example of the $M_i$ division section 114. The $M_i$ division unit 114 serves to divide the frequency division value $M_i$ providing the target tuning frequency $f_i$ by the frequency division value n of the count time pulse $P_c$ and includes a RAM 120 and a divider 121. The divider 121 divides the frequency value $M_i$ stored in the RAM 120 by the frequency division value n of the count time pulse $P_c$ sent from the synchronizing control unit 109 and supplies the division value $M_i/n$ thus obtained as a pulse count value of the tuning frequency $f_i$ in the present count time $T_c$ to the frequency difference detector 115.

FIG. 14 is a typical example of the frequency difference detector 115.

The frequency difference detector 115 includes a subtracter 122 and a multiplier 123. The subtracter 122 takes subtraction between the pulse count value $M_i/n$ sent from the $M_i$ division unit 114 and the pulse count value $N_i/n$ sent from the VCO counter 113. The difference value $(M_i/n)-(N_i/n)$ is multiplied by n by the multiplier 123 so that it is converted into frequency difference $\Delta f = M_i - n_i$ during the reference period Tref.

FIG. 15 shows a typical example of the LPF 102. As seen from FIG. 15, the LPF 102 includes a first amplifier 124 serving as a low pass filter and a second amplifier 125 serving as an adder/subtracter. The switch 106 for turning on/off the phase comparison loop (FIG. 8) is connected between an input and output of the first amplifier 124. The switch 106 is turned on/off by the reset signal RS (FIG. 12H) outputted from the synchronizing control unit 109. To the input terminal of the first amplifier 124, a phase difference signal $\Delta\theta$ is inputted, whereas to the non-inverting terminal of the second amplifier 125, an analog signal from the D/A converter 108 is inputted.

When the reset signal RS supplied from the synchronizing control unit 109 is at the "H" level, i.e., in the control state by the frequency comparison loop, the switch 106 is turned on or closed to shortcircuit the input and output of the first amplifier 124. The phase comparator 101 connected to the input terminal of the first amplifier 124 has a circuit configuration providing high output impedance. Thus, when the switch 106 remains closed, the second amplifier 125 operates as a buffer amplifier so that only the output from the D/A converter 108 inputted to the input terminal of the second amplifier 125.

On the other hand, when the reset signal RS supplied from the synchronizing control unit 109 is at the "L" level as shown in FIG. 12H, i.e., in the control state by the phase comparison loop, the switch 106 is turned off (or opened) so that the first amplifier 124 serves as a low pass filter. When the reset signal RS becomes "L" level, the phase comparator 101 also starts the phase comparison operation (FIGS. 12I and 12J).

Therefore, when the switch 106 is opened, the phase difference signal $\Delta f$ sent from the phase comparator 101 is converted in a DC signal by the first amplifier 124 serving as a low pass filter, and the DC signal is supplied to the inverting input terminal of the second amplifier 125. Then, in place of the control hitherto made by the frequency comparison loop, the control by the phase comparison loop is started.

When the control by the phase comparison loop is started, the analog signal inputted to the non-inverting input terminal of the second amplifier 125 from the D/A converter 108 is fixed at the frequency data held in the latch circuit 118 when the frequency comparison loop is shifted into the phase comparison loop, i.e., the value substantially equal to the target tuning frequency $f_i$. Thus, the above phase difference signal $\Delta f$ is added to or subtracted from this analog signal so that the oscillating frequency $f_O$ of the VCO 103 is finely adjusted to be accurately coincident with the target frequency $f_i$.

As described above, in accordance with the second aspect of the present invention, the PLL circuit can be locked up in a very short time as described above. When the input/output conversion characteristic of the D/A converter 108 is different from that of the VCO 103, it takes a redundant time for the oscillating frequency of the VCO 103 to reach the target tuning frequency $f_i$.

Figure 17:
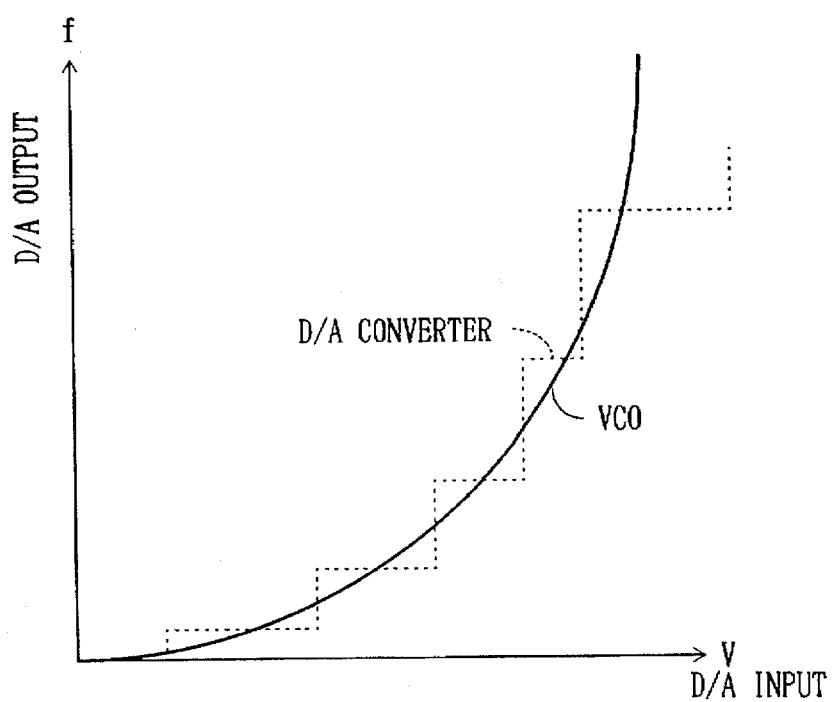
FIG. 17 s a graph showing the I/O conversion characteristic in the D/A converter in FIG. 16.
Figure 16:
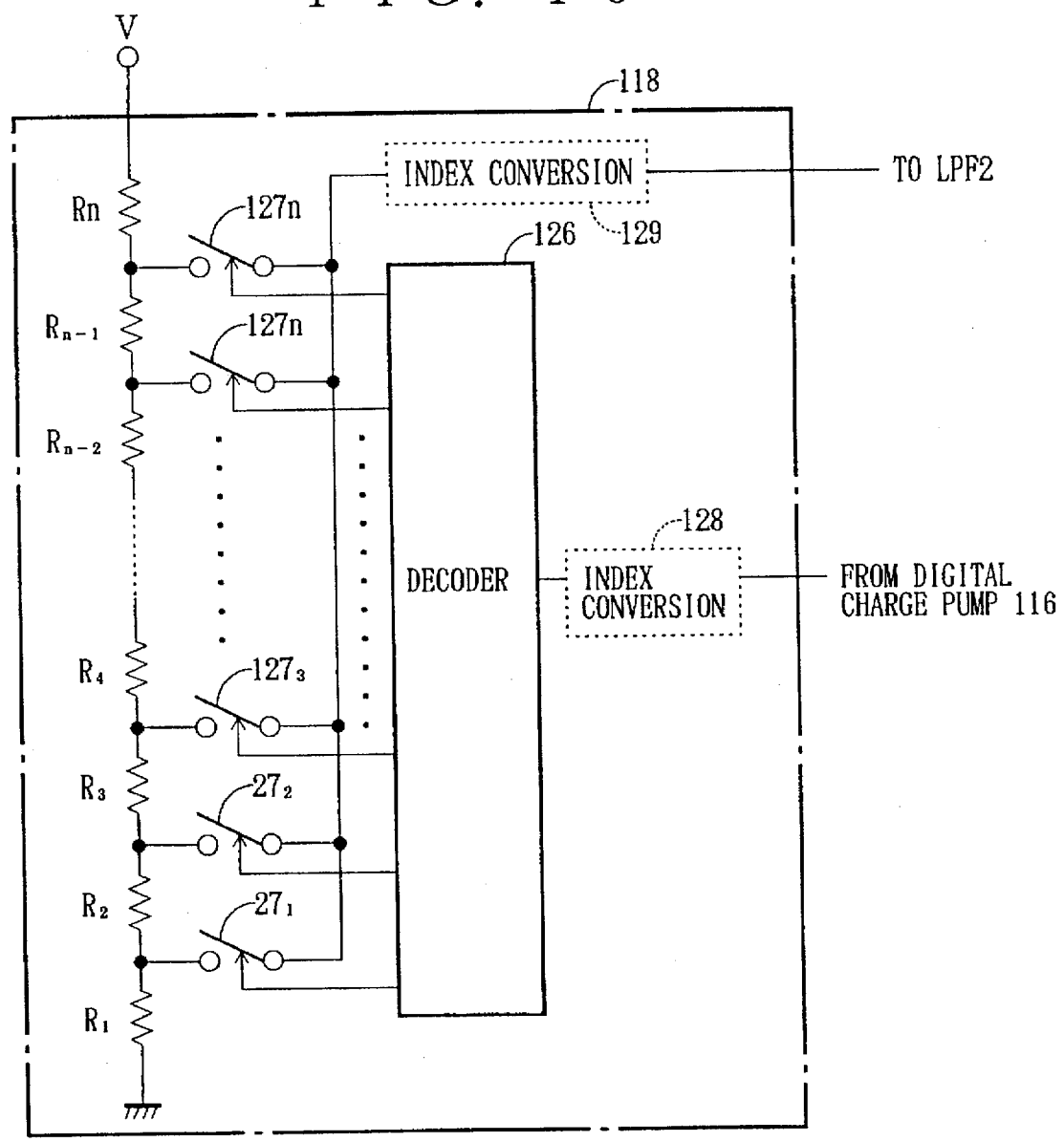
FIG. 16 s a concrete example of the D/A converter 108 in FIG. 11.
Figure 18:
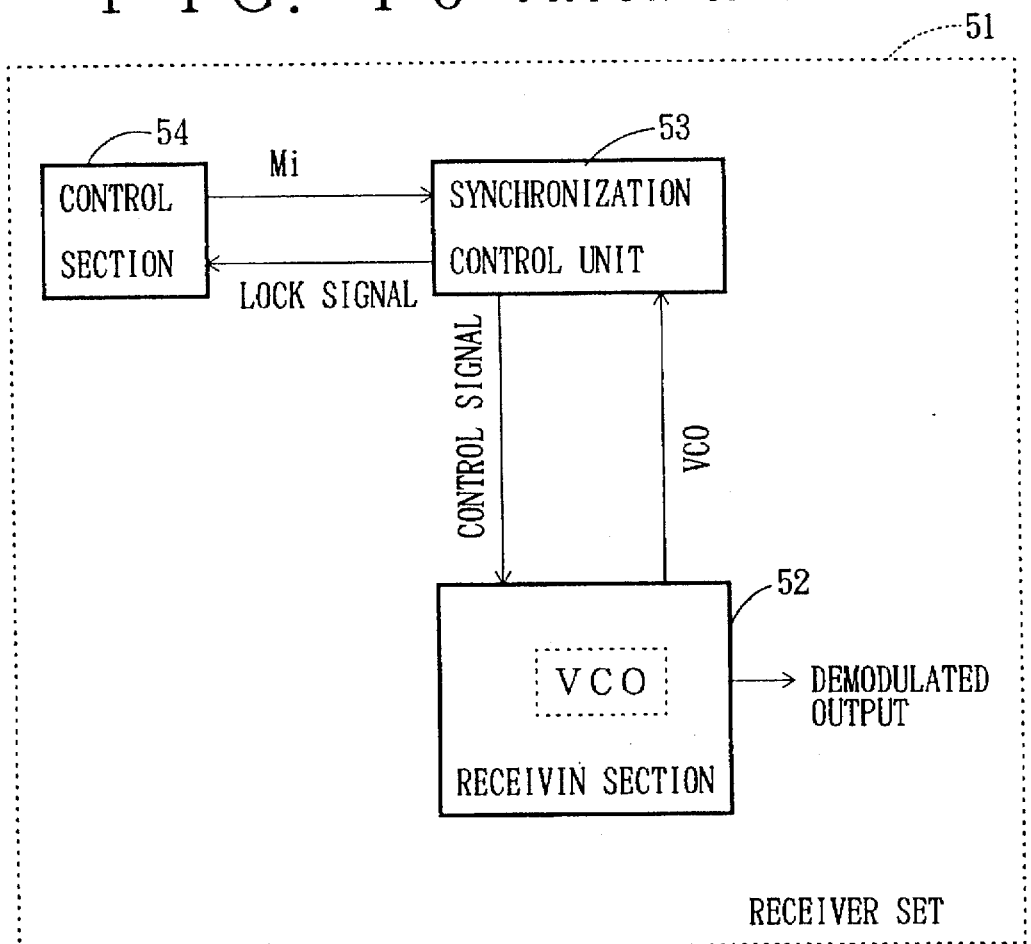
FIG. 18 s a schematic block diagram showing a conventional receiver.

In order to remove the conversion error, the D/A converter preferably has such a circuit configuration as shown in FIG. 16. The D/A converter 108 in FIG. 16 converts a digital signal into an analog signal in such a manner that the data inputted from the digital charge pump 116 is decoded by the decoder 126 and the corresponding switches $127_1$ to $127_n$ are turned on or off to shortcircuit or open resisters $R_i$ to $R_n$. In this case, as shown in FIG. 17, the resistors $R_1$ to $R_n$ are previously weighted so the input/output conversion characteristic of the D/A converter is substantially equal to the voltage-frequency conversion characteristic of the VCO 103.

In place of weighting the resistors $R_1$ to $R_n$, as indicated by dotted line in FIG. 16, an index conversion circuit 128 or 129 using the B–E characteristic of a transistor may be connected at the input side or output side.

What is claimed is:

1. A receiver comprising a control section; a tuning control section and a signal receiving section which includes a VCO which can vary a tuning frequency under the control of the tuning control section so as to be tuned to the frequency of a desired channel, demodulates a modulated signal and outputs the demodulated signal;

said control section capable of outputting, to said tuning control section, a storage instructing signal inclusive of tuning frequency information to be stored and its address and a read instructing signal inclusive of information for designating an address of the tuning frequency information stored and information for instructing the read of the tuning frequency information stored at the designated address; and said tuning control section capable of holding the inputted tuning frequency information at the designated address in accordance with the storage instructing signal supplied from said control section and of controlling the oscillating frequency of the VCO based on the tuning frequency information held at the designated address in accordance with the read instructing signal supplied from said control section.

2. A receiver according to claim 1, wherein the tuning control section stores a control value for controlling the oscillating frequency of said VCO corresponding to said tuning frequency stored.

3. A frequency synthesizer tuner comprising a frequency comparing means for acquiring a signal indicative of a frequency difference between a target tuning frequency and an oscillating frequency of a VCO; a frequency comparison loop for feeding back the acquired signal indicative of the frequency difference to the VCO to control the oscillating frequency of the VCO so that the tuning frequency is adjusted; and a count time setting means for setting the count time to measure the oscillating frequency of the VCO used by the frequency comparing means, wherein the count time is increased whenever measurement of the oscillating frequency of the VCO is repeated by the frequency comparing means.

4. A frequency synthesizer tuner according to claim 3, wherein at least the frequency comparing means is constituted as a digital circuit, and a D/A converter is provided at the output of the frequency comparing means so that the input/output conversion characteristic of the D/A converter is the same as the voltage—frequency characteristic of the VCO.

5. A frequency synthesizer tuner according to claim 4, wherein said D/A converter includes a plurality of resistors weighted so that its input/output conversion characteristic of the D/A converter is the same as the voltage—frequency characteristic of the VCO.

6. A frequency synthesizer tuner according to claim 4, wherein said D/A converter includes an index circuit connected to its input side or output side so that its input/output conversion characteristic of the D/A converter is the same as the voltage—frequency characteristic of the VCO.

* * * * *